(12) United States Patent
Yokoyama et al.

(10) Patent No.: US 6,507,379 B1
(45) Date of Patent: *Jan. 14, 2003

(54) LIQUID CRYSTAL PROJECTION DEVICE HAVING A LIQUID CRYSTAL DISPLAY ELEMENT THAT INCLUDES AN ELECTROLUMINESCENT ELEMENT

(75) Inventors: Osamu Yokoyama; Satoru Miyashita; Tatsuya Shimoda, all of Suwa (JP)

(73) Assignee: Seiko Epson Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/983,446
(22) PCT Filed: May 9, 1997
(86) PCT No.: PCT/JP97/01571
§ 371 (c)(1), (2), (4) Date: Feb. 27, 1998
(87) PCT Pub. No.: WO97/43686
PCT Pub. Date: Nov. 20, 1997

(30) Foreign Application Priority Data

May 10, 1996 (JP) ............................................. 8-116569
Jul. 25, 1996 (JP) ............................................. 8-196802

(51) Int. Cl.⁷ .......................................... G02F 1/1335
(52) U.S. Cl. ........................................ 349/69; 349/96
(58) Field of Search ..................................... 349/69, 96

(56) References Cited

U.S. PATENT DOCUMENTS

| 4,500,173 A | 2/1985 | Leibowitz et al. |
| 5,135,300 A | 8/1992 | Toide et al. |
| 5,719,467 A | * 2/1998 | Antoniadis et al. ......... 313/506 |
| 5,814,416 A | * 9/1998 | Dodabalapur et al. ...... 428/690 |

FOREIGN PATENT DOCUMENTS

| EP | 0 606 939 A1 | 7/1994 |
| JP | A-51-119243 | 10/1976 |

(List continued on next page.)

OTHER PUBLICATIONS

Kido et al., "Multilayer White Light–Emitting Organic Electroluminescent Device", *Science*, vol. 267, No. 5202, Mar. 3, 1995, pp. 1332–1334.

(List continued on next page.)

*Primary Examiner*—James Dudek
(74) *Attorney, Agent, or Firm*—Oliff & Berridge, PLC

(57) ABSTRACT

A liquid-crystal projection device includes an organic electroluminescent element that is sandwiched by an organic thin-film layer between an electrode layer that reflects light and a transparent electrode layer that transmits light, and a transparent liquid crystal panel that controls passage of light emitted from the surface of the organic electroluminescent element and also includes a half-mirror layer arranged on the side where light is output from the transparent electrode layer. Some of the incoming light is reflected through the transparent electrode layer to another electrode layer and the rest of the light is transmitted the distance between the half-mirror layer. The electrode layer is set to the optical distance of resonance of the light.

28 Claims, 9 Drawing Sheets

FOREIGN PATENT DOCUMENTS

| JP | A-55-161272 | 12/1980 |
| JP | A-2-176628 | 7/1990 |
| JP | A-3-223811 | 10/1991 |
| JP | A-3-241311 | 10/1991 |
| JP | A-4-129191 | 4/1992 |
| JP | A-4-144094 | 5/1992 |
| JP | A-4-229825 | 8/1992 |
| JP | A-5-281508 | 10/1993 |
| JP | A-6-160842 | 6/1994 |
| JP | A-7-36032 | 2/1995 |
| JP | A-7-72809 | 3/1995 |
| JP | A-63-29737 | 2/1998 |
| WO | WO 92/22838 | 12/1992 |
| WO | WO 97/12276 | 4/1997 |

OTHER PUBLICATIONS

Tsutsui et al., "Sharply Directed Emission in Organic Electroluminescent Diodes with an Optical–Microcavity Structure", *Applied Physics Letters*, Oct. 10, 1994 American Institute of Physics, vol. 65, No. 15, pp. 1868–1870.

Kido et al., "Multilayer White Light–Emitting Organic Electroluminescent Device", *SCIENCE*, vol. 267, No. 5202, Mar. 3, 1995, pp. 1332–1334.

Tsutsui et al., "Sharply Directed Emission in Organic Electroluminescent Diodes with an Optical–Microcavity Structure" *Applied Physics Letters*, Oct. 10, 1994 American Institute of Physics, vol. 65, No. 15 pp. 1868–1870.

* cited by examiner

LIQUID CRYSTAL PROJECTION DEVICE HAVING A LIQUID CRYSTAL DISPLAY ELEMENT THAT INCLUDES AN ELECTROLUMINESCENT ELEMENT

BACKGROUND OF THE INVENTION

1. Field of the Invention

The present invention relates to a liquid-crystal projection device i.e. what is known as a projector and in particular relates to improvements in the light source and peripheral optical system of a small-size liquid-crystal projection device.

2. Description of the Relate Art

As the light sources employed in conventional liquid-crystal projection devices, light sources using a fluorescent tube or light-guide plate or electrical discharge-type light sources such as metal halide lamps have come to be employed.

In particular, Japanese Patent Laid-Open number Sho.51-119243 discloses a flat plate-shaped light source. This specification states that the flat plate-shaped light source employs electroluminescence i.e. electroluminescent elements.

However, in the case of a light source employing a fluorescent tube or light-guide plate, it is difficult to make the diameter of the fluorescent tube etc. small. There was therefore the problem that miniaturization of a liquid-crystal projection device was difficult, since the thickness of the light source itself could not be reduced below the diameter of the fluorescent tube.

Also, in the case of an electric discharge-type light source such as a metal halide lamp, the reflector of large aperture that was considered necessary to direct the light diverging from the light source parallel to the liquid crystal panel was a factor impeding miniaturisation of the liquid-crystal projection device.

In particular in the came of a liquid-crystal projection device for colour display, further miniaturisation of the liquid-crystal projection device was difficult owing to the need to provide liquid crystal display elements consisting of a light source as aforementioned and liquid crystal panel for each of the primary colours constituting the colour image.

Also, Japanese Patent Laid-Open number Sho.51-119243 does not clearly disclose a material constituting a luminescent layer of an electroluminescent element. When the conventional inorganic electroluminescent material is employed as material for this luminescent layer, light from the electroluminescent element in light of a highly divergent character. This therefore suffered from the problem that projection of a bright image could not be achieved since the light could not be effectively directed into the aperture of the projection lens.

A further problem was that the drive voltage required for an electroluminescent element using inorganic material is at least 100 volts, which is comparatively high.

SUMMARY OF THE INVENTION

An object of the present invention is to provide a liquid-crystal projection device wherein, in order to solve the above problems, greater miniaturisation than conventionally can be achieved and in which a bright image can be projected with low voltage.

In more detail, a first task of the present invention is to provide a miniature liquid-crystal projection device that can be driven with lower voltage than conventionally and whereby a brighter image than conventionally can be projected by preventing the diminution in the amount of light produced by divergence of the light, by employing an organic electroluminescent element having a resonator structure whereby light of good optical emission directionality is emitted.

A second task of the present invention is to provide a miniature liquid-crystal projection device whereby a brighter image than conventionally can be projected by increasing the amount of light that can be transmitted through the polarizing plate of the liquid crystal panel by using a polarization conversion element that can convert the condition of polarization of the emitted light from the light source.

A third task of the present invention is to provide a miniature liquid-crystal projection device whereby a brighter image than conventionally can be projected, by increasing the amount of light that can be transmitted through the polarizing plate of the liquid crystal panel by employing a polarisation conversion element that functions in a specified wavelength band in projecting a colour image.

A fourth task of the present invention is to provide a miniature liquid-crystal projection device whereby a brighter image than conventionally can be projected by increasing the amount of light that can be transmitted through the aperture of a pixel and miniaturising the device itself by employing a miniature luminescent element comprising a microlens array element that focuses the light on to pixel apertures of the liquid crystal panel.

A fifth task of the present invention is to provide a miniature liquid-crystal projection device whereby a clear image can be projected by raising the purity of the light that is projected and the brightness compared with conventionally, by increasing the amount of light consisting of light of only a specified wavelength by employing miniature lumuinescent elements that emit light of only a specified wavelength, due to optical resonance, in projection of a colour image.

A liquid-crystal projection device according to claim 1 consists in a liquid-crystal projection device having a liquid crystal display element comprising: an organic electroluminescent element constructed by sandwiching an organic thin-film element between an electrode layer that reflects light and an electrode layer that transmits light; and a transparent liquid crystal panel that controls the transmission of light emitted from a face of the organic electroluminescent element.

A liquid-crystal projection device according to claim 2 consists in a liquid-crystal projection device according to claim 1 wherein the organic thin-film layer is constituted as a white luminescent layer that emits white light.

A liquid-crystal projection device according to claim 3 consists in a liquid-crystal projection device according to claim 1 wherein the organic thin-film layer is constituted by successively stacking primary colour luminescent layers that respectively emit light of respective wavelength regions of a plurality of primary colours necessary for colour display.

A liquid-crystal projection device according to claim 4 consists in a liquid-crystal projection device according to claim 1 wherein the organic electroluninescent element in constituted of a transparent electrode layer overlying a transparent substrate, the organic thin-film layer overlying this transparent electrode layer and an electrode layer overlying the organic thin-film layer and that reflects light emitted by the organic thin-film layer.

A liquid-crystal projection device according to claim 5 consists in a liquid-crystal projection device according to claim 1 wherein the organic electroluminescent element comprises: an electrode layer that reflects light emitted from the organic thin-film layer; a transparent electrode layer that sandwiches the organic thin-film layer between itself and this electrode layer; and a half-mirror layer provided on the optical output side from this transparent electrode layer and that reflects some of the incoming light through the transparent electrode layer into the electrode layer, while transmitting the rest of this light; and the distance between this half-mirror layer and the electrode layer is set to an optical distance that produces resonance of the light in question.

A liquid-crystal projection device according to claim 6 consists in a liquid-crystal projection device according to any one of claims 1 to 5 wherein, between the organic electroluminescent element and the transparent liquid crystal panel there is further provided a polarization conversion element that converts the polarization condition of emitted light from the organic electroluimnescent element, and the transparent liquid crystal panel is provided with a polarizing plate that transmits light of specified polarization condition, of the light emitted after passing through the polarization conversion element.

A liquid-crystal projection device according to claim 7 consists in a liquid-crystal projection device according to claim 6 wherein the polarization conversion element comprises: a circular polarization selective reflection filter arranged on the organic electroluminescent element side and that reflects one circularly polarized component of right-handed circularly polarized light and left-handed circularly polarized light and that transmits the other circularly polarized component, and a ¼ wavelength plate that converts circularly polarized light to linearly polarized light and that converts linearly polarized light to circularly polarized light.

A liquid-crystal projection device according to claim 8 consists in a liquid-crystal projection device according to claim 6 wherein the polarization conversion element comprises: a linearly polarized light selective reflection filter arranged on the transparent liquid crystal panel side and that, of two perpendicular linearly polarized components, reflects one linearly polarized component and transmits the other linearly polarized component, and a ¼ wavelength plate that converts circularly polarized light into linearly polarized light and that converts linearly polarized light into circularly polarized light.

A liquid-crystal projection device according to claim 9 consists in a liquid-crystal projection device according to any of claims 6 to 8 wherein the polarization conversion element comprises a polarization selective reflection filter that, for the emitted light of a specified wavelength region, transmits light of this specified polarisation condition and reflects light o: other polarization conditions.

A liquid-crystal projection device according to claim 10 consists in a liquid-crystal projection device according to claim 6 wherein, between the organic electroluminescent element and the transparent liquid crystal panel, there is further provided a front-side microlens array element wherein microlens elements that collect output light from the organic electroluminescent element are arranged corresponding to individual pixels of the transparent liquid crystal panel.

A liquid-crystal projection device according to claim 11 consists in a liquid-crystal projection device according to claim 10 wherein the focal length of the microlens elements and the distance between the front-side microlens array element and this liquid crystal panel are adjusted such that the apertures of the individual pixels of the transparent liquid crystal panel are arranged in the vicinity of the rear-side focal point of the microlens elements.

A liquid-crystal projection device according to claim 12 consists in a liquid-crystal projection device according to any of claims 10 or 11 wherein the transparent liquid crystal panel comprises an optical screening element that transmits light that is incident on the aperture of each pixel and that screens light that in incident on portions other than the aperture of this pixel.

A liquid-crystal projection device according to claim 13 consists in a liquid-crystal projection device according to any of claims 10 to 12, further comprising a rear-side microlens array element constituted by arranging, corresponding to individual pixels, microlens elements that suppress divergence of light transmitted through the pixel apertures of the liquid crystal panel, on the side where light is output after passing through the transparent liquid crystal panel.

A liquid-crystal projection device according to claim 14 consists in a liquid-crystal projection device according to claim 13 wherein the focal length of the microlens elements and the distance between this rear-side microlens array element and this transparent liquid crystal panel are adjusted such that the apertures of the pixels are arranged in the vicinity of the front-side focal point of the rear-side microlens elements.

A liquid-crystal projection device according to claim 15 consists in a liquid-crystal projection device according to any of claims 10 to 14 wherein, between the organic electroluminescent element and the front-side microlens array element, there in further provided a polarization conversion element that converts the polarization condition of light that is output from the organic electroluminescent element, and the transparent liquid crystal panel comprises a polarizing plate that transmits light of specified polarization condition, of the light that is output after passing through the polarization conversion element.

A liquid-crystal projection device according to claim 16 consists in a liquid-crystal projection device according to claim 15 wherein the polarization conversion element comprises a circular polarization selective reflection filter arranged on the organic electroluminescent element side and that reflects one circularly polarized component of right-handed circularly polarized light and left-handed circularly polarised light and that transmits the other circularly polarized component, and a ¼ wavelength plate that converts circularly polarized light into linearly polarized light and that converts linearly polarized light into circularly polarised light.

A liquid-crystal projection device according to claim 17 consists in a liquid-crystal projection device according to claim 15 wherein the polarization conversion element comprises. a linear polarization selective reflection filter arranged on the front-side microlens array element side and that, of two perpendicular linear polarization components, reflects one linearly polarised component and transmits the other linearly polarized component, and a ¼ wavelength plate that converts circularly polarized light into linearly polarized light and that converts linearly polarized light into circularly polarized light.

A liquid-crystal projection device according to claim 18 consists in a liquid-crystal projection device according to any of claims 1, 4 or 5, further provided with a projection lens that projects on to a screen an image generated by passing through the transparent liquid crystal panel.

A liquid-crystal projection device according to claim 19 consists in a liquid-crystal projection device according to claim 18 further provided with a transparent screen whereby an image projected from the projection lens can be observed from the opposite side of this projection lens.

A liquid-crystal projection device according to claim 20 consists in a liquid-crystal projection device according to any of claim 1 or claim 4, further provided with a plurality of liquid crystal display elements that control the transmission of light of respective wavelength regions of a plurality of primary colours necessary for colour display; a combining optical system that generates a colour image by combining images of primary colours emitted from the plurality of liquid crystal display elements; and a projection lens that projects on to a screen a colour image combined by the combining optical system.

A liquid-crystal projection device according to claim 21 consists in a liquid-crystal projection device according to claim 20 wherein the plurality of organic electroluminescent elements are provided with an optical resonant structure.

A liquid-crystal projection device according to claim 22 consists in a liquid-crystal projection device comprising, for each primary colour, liquid crystal display elements including organic electroluminescent elements having an optical resonant structure adjusted such an to emit light of respective wavelength regions of a plurality of primary colours necessary for colour display and a transparent liquid crystal panel that controls the transmission of light emitted from the face of the organic electroluminescent elements; and further comprising a combining optical system that generates a colour image by combining images of each primary colour emitted from the respective liquid crystal display elements, and a projection lens that projects on to a screen the colour image combined by the combining optical system.

A liquid-crystal projection device according to claim 23 consists in a liquid-crystal projection device according to any of claims 20 to 22 further comprising a transparent screen constituted so that an image projected from the projection lens can be observed from the opposite side of this projection lens.

A liquid-crystal projection device according to claim 24 consists in a liquid-crystal projection device according to any of claims 20 to 23 wherein the liquid crystal display elements further comprise, between the organic electroluminescent element and the transparent liquid crystal panel, a front-side microlens array constituted by arranging, corresponding to individual pixels of the transparent liquid crystal panel, microlens elements that collect the light emitted from the organic electroluminescent element.

A liquid-crystal projection device according to claim 25 consists in a liquid-crystal projection device according to claim 24 wherein the liquid crystal display elements further comprise a rear-side microlens array element constituted by arranging, corresponding to each pixel, microlens elements that suppress divergence of light passing through the pixel apertures of the liquid crystal panel, on the output side of light that has passed through the transparent liquid crystal panel.

A liquid-crystal projection device according to claim 26 consists in a liquid-crystal projection device according to any of claims 24 or 25 wherein the front-side microlens array element and the rear-side microlens array element of the liquid crystal display elements comprise a reflection preventing film adjusted such that its reflectivity is lowest for light of the wavelength region of the primary colour allocated to the liquid crystal display element in question.

A liquid-crystal projection device according to claim 27 consists in a liquid-crystal projection device according to any of claims 20 to 26 wherein the liquid crystal display elements, between the organic electroluminescent element and the front-side microlens array element, are further provided with a polarization conversion element that converts the polarisation condition of emitted light, from the organic electroluminescent element, and the transparent liquid crystal panel is provided with a polarizing plate that transmits light of specified polarization condition of light that is emitted after having passed through the polarization conversion element.

A liquid-crystal projection device according to claim 28 consists in a liquid-crystal projection device according to claim 27 wherein the polarization conversion element of the liquid crystal display elements comprises a polarization selective reflection filter that transmits light of specified polarization condition with respect to the emitted light of a specified wavelength region and that reflects light of polarization condition other than this.

DESCRIPTION OF THE PREFERRED EMBODIMENTS

Next, preferred embodiments of the present invention are described with reference to the drawings.

Embodiment 1

(Layout)

Figure 1:
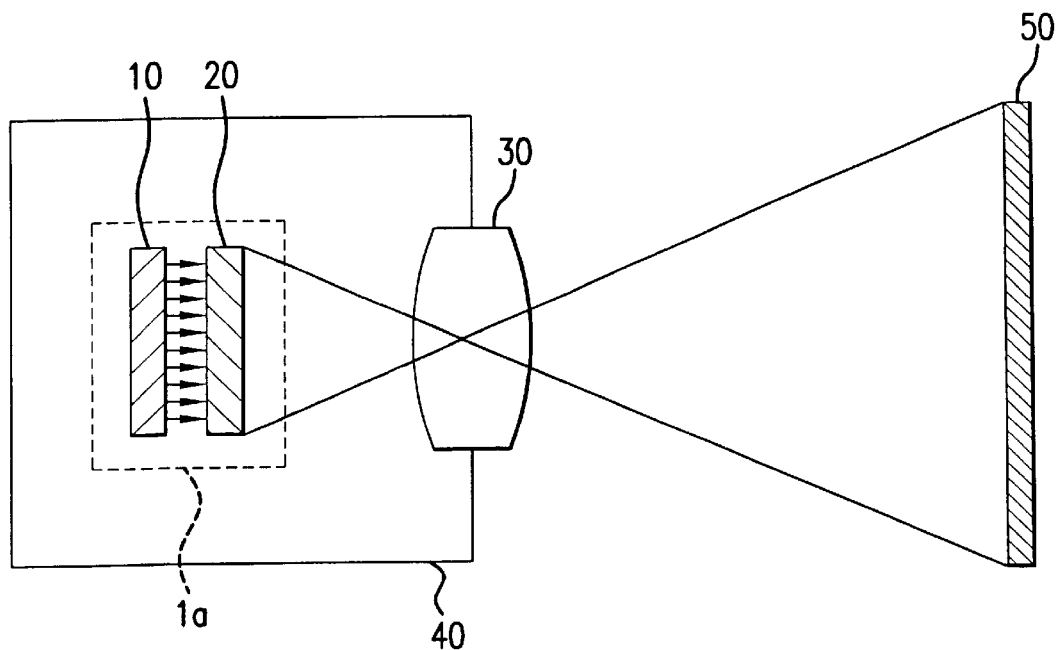
FIG. 1 is an overall layout diagram of a liquid-crystal projection device according to embodiment 1 of the present invention.

A liquid-crystal projection device according to the present invention, as shown in FIG. 1, comprises a liquid crystal display element 1a, projection lens 30 and frame 40.

Projection lens 30 in constituted such that an image emitted from liquid crystal display element 1a is imaged on a screen 50. Although only a single projection lens is shown in the Figure, this could of course be constituted by an assembly of a plurality of lenses. specifically, the projection lens may be constructed so as to for example magnify the image emitted from liquid crystal display element 1a before it is formed on screen 50.

Figure 2:
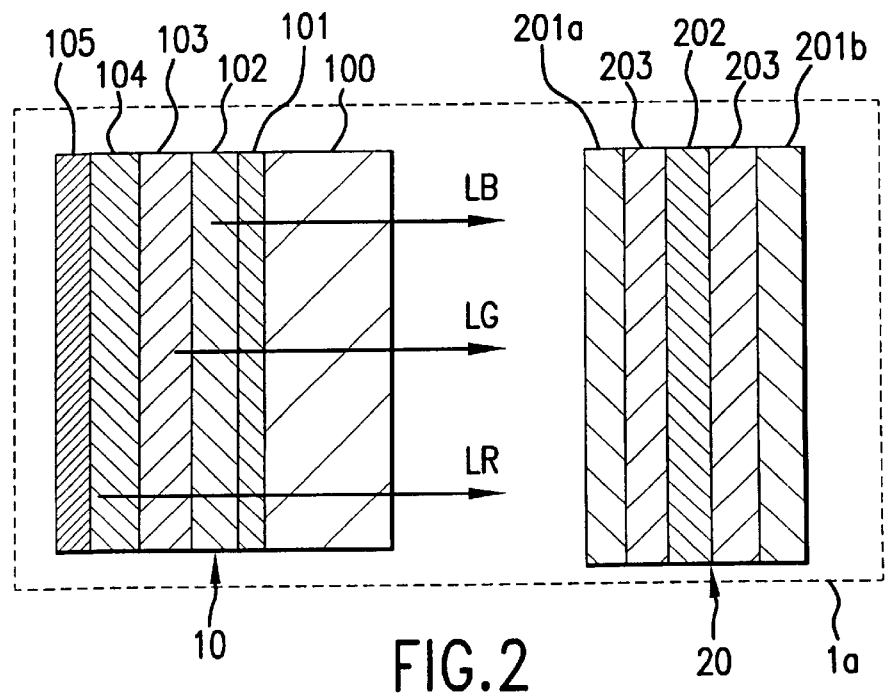
FIG. 2 is a layout diagram of a liquid crystal display element 1a (organic electroluminescent element 10 and transparent liquid crystal panel 20) according to embodiment 1.

Frame 40 in constituted an a receptacle for accommodating the entire liquid-crystal projection device and is constituted such that the optical elements are suitably arranged therein. Its material is constituted such that it is unaffected by deformation etc. due to the heat emission by liquid crystal display element 1a. Liquid crystal display element 1a, as shown in FIG. 2, comprises an organic electroluminescent element 10 and transparent liquid crystal panel 20 and is constructed to omit a modulated image.

Organic electroluminescent element 10 is constituted of successive layers: transparent electrode layer 101, blue luminescent layer 102, green luminescent layer 103, red luminescent layer 104 and reflective electrode layer 105 on transparent substrate 100.

Transparent substrate 100 consists of optically transparent material such as glass and is constituted of material of high mechanical strength. Its thickness is adjusted so as not to be too thin, in order to maintain enough mechanical strength to act as a light source, yet not to be so thick as to result in lose of optical transparency or excessive weight. The area of this substrate is preferably slightly larger than the area of liquid crystal panel 20. If its area is too large, power is wasted in unused illumination and the contrast of the projected image is adversely affected by leakage of light. If the area is too small, sufficient illuminating light in not supplied to the peripheral section of the liquid crystal panel, producing non-uniformity of the amount of light.

Transparent electrode layer 101 is constituted of a material having optical transparency such as ITO (Indium Tin oxide) and that has electrical conductivity. Its film thickness is adjusted so that it is not too thin for its film thickness to be kept uniform during manufacture yet is not so thick as to result in loss of optical transparency.

Blue luminescent layer 102, green luminescent layer 103 and red luminescent layer 104 are each constituted of organic thin-film layers containing organic molecules that emit light on application of an electrical field. Blue luminescent layer 102 is constituted by organic molecules that emit light in the blue-wavelength region. Green luminescent layer 103 in constituted by organic molecules that emit light in the groan wavelength region. Red luminescent layer 104 is constituted by organic molecules that emit light in the red wavelength region.

As blue electroluminescent layer 202 that emits light of blue colour, there may be employed a laminated structure consisting of a triphenyldiamine derivative whose peak luminescence wavelength is about 380 to 420 nm and a 1,2,4-triazole derivative; as green luminescence layer 103 that emits light of green colour, there may be employed aluminium tris (8-quinolilate) whose peak luminescence wavelength in about 520 nm; and as the rod luminescence layer 104 that emits light of red colour, there may be employed aluminium tris (8-quinolinate) to which has been added red luminescent chromogenic material, whose peak luminescence wavelength is about 600 nm. These materials are disclosed in science, Vol. 267 pp. 1332–1334 (1990).

Preferably the area of the luminescent layers is equal to that of the transparent electrode layer.

Reflective electrode layer 105 is constituted comprising a metallic layer that reflects light and has electrical conductivity.

Examples of such metals that may be given include magnesium-silver alloys etc. Its film thickness is adjusted such that the film thickness can be maintained uniform but does not provide excess weight. Its area in preferably the same as that of transparent electrode layer 101.

To simplify the description, the power source circuit that applies voltage between transparent electrode layer 101 and reflecting electrode layer 103 is not shown in the drawing.

Transparent liquid crystal panel 20 is constituted comprising polarizing plates 201a, 201b, transparent substrate 203 and liquid crystal layer 202. Those constructional items are the same as in a commonly known transparent liquid crystal panel in this Figure, in order to facilitate understanding, the drive circuitry provided on the transparent substrate and the display circuitry that supplies control signals to the transparent electrode, wiring and drive circuitry are not shown.

Polarizing plates 201a and 201b have the same construction and are constituted such an to transmit only light of a specified polarization condition of the incident light. However, the direction of polarization (direction of oscillation) of the light passing through polarizing plate 201b is arranged to be offset by a fixed angle with respect to the direction of polarization transmitted through polarizing plate 201a. This angle is set so as to be equal to the angle of rotation of the plane of polarization whereby liquid crystal layer 202 rotates the plane of polarization of light incident thereon when no voltage is applied to it.

For liquid crystal layer 202, a known twisted nematic liquid crystal or the like is employed; when voltage is applied to it does not rotate the plane of polarization of incident light, but when voltage is not applied to it, it rotates the plane of polarization of incident light.

Transparent substrate 203 is provided with a transparent electrode (not shown) on the liquid crystal layer side, and a drive circuit is provided that is capable of driving the liquid crystal for each pixel. The construction is such that optical modulation can be achieved by transmitting or not transmitting light from organic electroluminescent element 10 in response to change of voltage of a control signal supplied from the drive circuit.

Preferably, organic electroluminescent element 10 is provided with a cooling mechanism that cools the organic electroluminescent element.

(Action)

When an electrical field is applied to the electroluminescent element, this exhibits electroluminescence. When an electrical field is applied to a material that produces electroluminescence, the electroluminescence phenomenon is produced and the electrical energy is converted into light.

Conventionally, as electroluminescent elements, the inorganic materials ZnS, SrS, and CaS were employed. However, with these inorganic materials, the intensity of the light is weak, and the emitted light is not emitted in parallel but constitutes divergent light.

In contrast, with the electroluminescent element of the present invention, an organic material in employed. The amount of light emitted due to electroluminescence is large because of light emission due to recombination of electrons injected from the cathode and positive holes injected from the anode. Luminescent layers 102 to 104 constitute luminescent elements using this organic material When voltage in applied between transparent electrode layer 101 and reflective electrode layer 105, an electrical field is generated corresponding to the film thickness of the luminescent layer and the applied voltage in each luminescent layer sandwiched by two electrode layer. The organic molecules of each luminescent layer exhibit the electroluminescence phenomenon when they are subjected to this electrical field and generate light in a fixed wavelength region The intensity of this light is correlated with the applied voltage. Each luminescent layer has an electrical field applied to it which depends on the film thickness, go the luminescence depends on the intensity of the electrical field. If the areas of transparent electrode layer 101, luminescent layers 102 to 104 and reflective electrode layer 105 are made practically equal, the intensities of the electrical fields in each portion of the luminescent layers are practically uniform. That is, uniform light is emitted from the entire surface of the organic electroluminescent element. The blue-coloured light from blue luminescent layer 102 passes directly through transparent electrode layer 101 and is emitted from the transparent substrate. The green light from green luminescent layer 103 passes through blue luminescent layer 102 and transparent electrode film 101 to be emitted from the transparent substrate. The red light from red luminescent layer 104 passes through green luminescent layer 103, blue luminescent layer 102 and transparent electrode film 101 to be emitted from the transparent substrate. If the film thicknesses etc. of the luminescent layers are adjusted such that the same amount of light of each primary colour is emitted from the transparent substrate, white light is obtained by equal summation of the primary colours.

Although light is also emitted from each luminescent layer in the opposite direction to the liquid crystal panel, this light is reflected by reflecting electrode layer 105 and returned towards liquid crystal panel 20.

Consequently, the light that is returned from reflecting electrode layer 105 is added to the light that is directly emitted from each luminescent layer, resulting in an increased amount of light being emitted to outside transparent substrate 100.

In particular, an organic electroluminescent element as employed in the present invention is well adapted as a light source for a liquid-crystal projection device, since it has the characteristic advantages of ability to be driven at low voltage and higher brightness than the inorganic electroluminescent elements that were conventionally employed as a flat plate-shaped light source.

At liquid crystal panel 20, of the light from organic electroluminescent element 10, only light having a specified plane of polarisation passes through polarizing plate 201a. When a control signal is supplied to the control circuit formed on transparent substrate 203, voltage is applied between the transparent electrodes of the pixel in question. In a pixel that has voltage applied between its transparent electrodes, the liquid crystal molecules in the region of this pixel are aligned in the direction of the electrical field. Consequently, in the case of a pixel that has voltage applied to it, rotation of the plane of polarization is not applied to incident light, and such light reaches polarizing plate 201b on the opposite side. However, the direction of polarization in which transmission is possible through polarizing plate 201b is offset from that of polarizing plate 201a, so the incident light cannot pass through polarizing plate 201b.

On the other hand, if control voltage is not applied to the drive circuit, voltage is not applied between the electrodes of the pixel in question. In the case of a pixel to which voltage is not applied, the liquid crystal molecules in this pixel region are aligned in the horizontal direction, so rotation of the plane of polarization is applied to the incident light. Consequently, in the came of pixels to which voltage is not applied, rotation of the plane of polarization is applied to the incident light, and this therefore reaches polarizing plate 201b on the opposite side. Polarizing plate 201b is arranged offset from polarizing plate 201a by the angle of rotation of the plans of polarization that is applied to this incident light, so the incident light passes through polarizing plate 201b and reaches screen 50 through projection lens 30.

In this way, display/non-display can be set up for each pixel by means of a control signal.

The liquid crystal display element in formed of a size of for example about 33 mm (1.3 inch) diagonal, and can be driven by a drive voltage of about 10 volts.

In order to obtain a construction in which a colour image can be projected on to a screen, colour filters are formed in the pixels of the liquid crystal panel. By such a construction, colour can be generated when white light passes through the liquid crystal panel.

As described above, with this embodiment 1, no large reflector needs to be employed for the light source, so that the display device can be miniaturised.

Also, since the organic electroluminescent element supplies bright light to the liquid crystal panel, a liquid-crystal projection device can be provided in which a bright image is obtained.

Embodiment 2

Embodiment 2 of the present invention provides an organic electroluminescent element whereby white light is obtained by luminescent layers different from those of embodiment 1.

(Construction)

Figure 3:
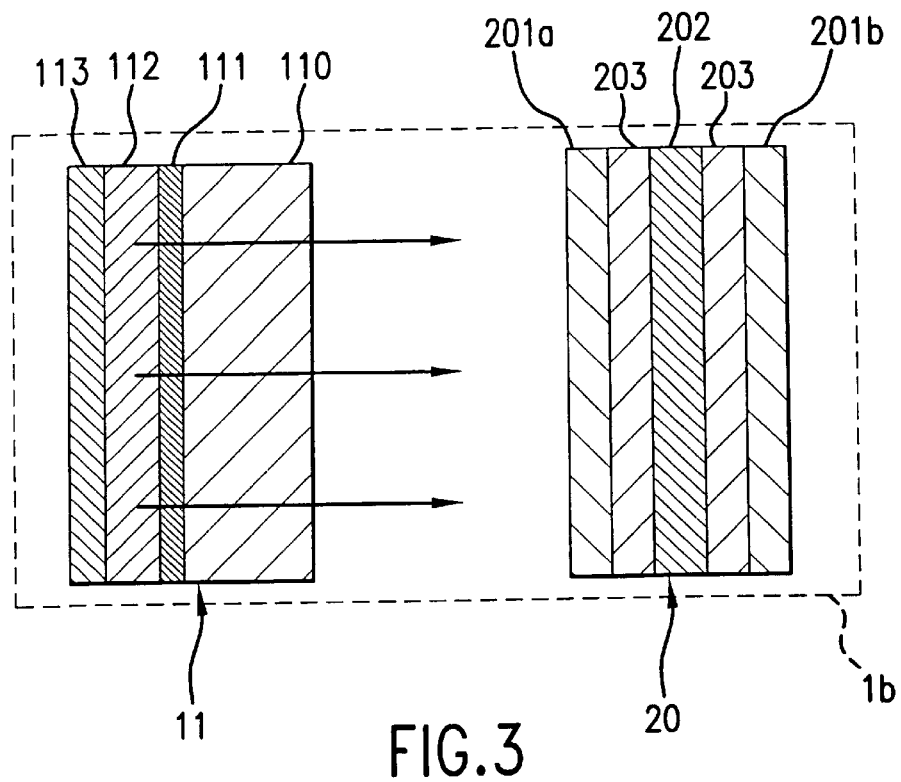
FIG. 3 is a layout diagram of a liquid crystal display element 1b (organic electroluminescent element 11 and transparent liquid crystal panel 20) according to embodiment 2.

A liquid-crystal projection device according to embodiment 2 has the same construction (see FIG. 1) as embodiment 1 described above, except that liquid crystal display element 1b differs from embodiment 1 in that, as shown in FIG. 3, it comprises an organic electroluminescent element 11. The construction of liquid crystal panel 20 is identical with that of the first embodiment so a description thereof is omitted.

Organic electroluminescent element 11 is constituted by laminating a transparent electrode layer 111, white luminescent layer 112 and reflecting electrode layer 113 on to transparent substrate 110. Transparent substrate 110 is the same as transparent substrate 100 of embodiment 1, transparent electrode layer 111 is the same an transparent electrode layer 101 of embodiment 1, and reflecting electrode layer 113 is the same as reflecting electrode layer 105 of embodiment 1, respectively, so description thereof is omitted. Depiction of the power source circuit for applying voltage between the transparent electrode layer and reflecting electrode layer in omitted just as in the case of embodiment 1.

White luminescent layer 112 is an organic thin-film layer which, when an electrical field is applied to it, emits light of a plurality of wavelength regions, so that white light is emitted from the layer as a whole. An example that may be given of an organic thin film that emits white light in response to application of an electrical field is a thin film in which there is a molecular dispersion of a low molecular electron transporting compound and a plurality of chromogenic materials constituting centres of luminescence in poly(N-vinyl carbazole) vinyl. Such a luminescent film structure is disclosed in applied Physics Letters vol. 67 No. 16, pp. 2281–2283 (1995).

(Action)

When voltage in applied between transparent electrode layer 111 and reflecting electrode layer 113, an electrical field is generated corresponding to the film thickness of this white luminescent layer and the value of this voltage. White luminescent film 112 emits simultaneously light of a plurality of primary colour wavelength regions in response to the intensity of this electrical field; the light of this plurality of wavelength regions is summed and emitted from the transparent substrate. White light is therefore supplied to liquid crystal panel 20.

It should be noted that, although in this embodiment, a luminescent layer was constituted by an organic thin film emitting white light such that a colour image could also be projected, it would alternatively be possible to provide as luminescent layer an organic thin film emitting a single colour such as green, red or blue. In this came, an image of this single colour is generated.

In organic electroluminescent element 11, it would also be possible to provide a cooling mechanism for cooling the organic electroluminescent element.

As described above, with embodiment 1, a large reflector in not employed, so the display device can be miniaturized.

Also, since a beam of bright parallel light can be supplied to the liquid crystal panel, a liquid-crystal projection device can be provided whereby a bright image can be obtained.

Embodiment 3

Embodiment 3 of the present invention relates to an organic electroluminescent element whose directionality in the direction normal to the light-emitting face is strong due to an optical resonant structure and whereby light of specified wavelength is emitted.

(Construction)

Figure 4:
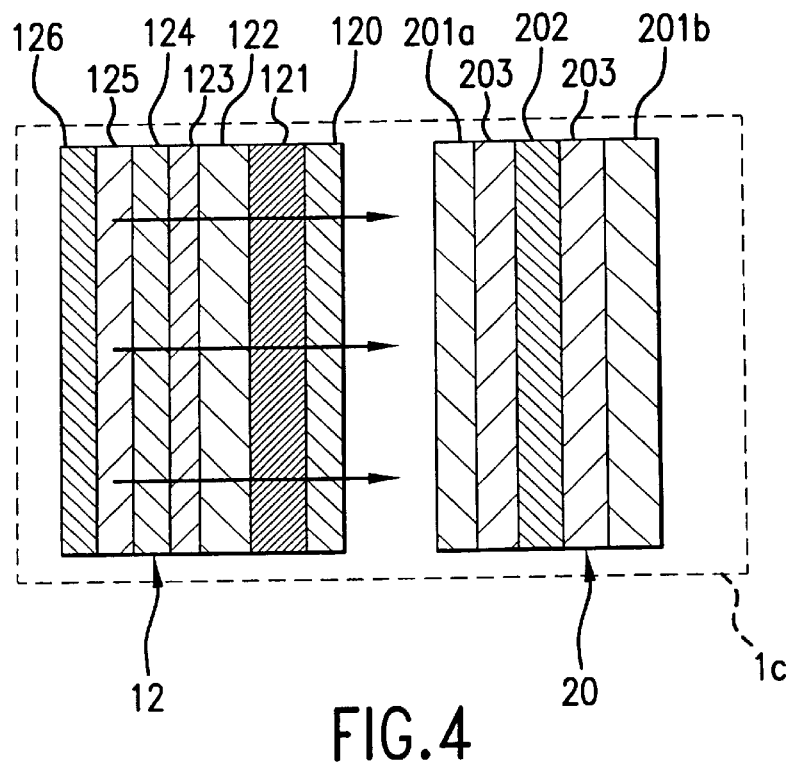
FIG. 4 is a layout diagram of a liquid crystal display element 1c (organic electroluminescent element 12 and transparent liquid crystal panel 20) according to embodiment 3.

A liquid-crystal projection device according to embodiment 3 has the same construction as embodiment 1 (see FIG. 1) except for liquid crystal display element 1c. As shown in FIG. 4, liquid crystal display element 1c comprises an organic electroluminescent element 12 and a transparent liquid crystal panel 20. Liquid crystal panel 20 is identical with that of embodiment 1, so further description in omitted.

Organic electroluminescent element 12 in constituted by successive layers consisting of transparent substrate 120, a dielectric mirror layer 121, a spacing adjustment layer 122, a transparent electrode layer 123, a positive hole transport layer 124, a luminescent layer 125, and reflecting electrode layer 126.

Transparent substrate 120 is the same an transparent substrate 100 of embodiment 1, transparent electrode layer 123 is the same as transparent electrode layer 101 of embodiment 1, and reflecting electrode layer 126 is the same as reflecting electrode layer 105 of embodiment 1, respectively, so further description is omitted. Just an in embodiment 1, depiction of the power source circuitry for applying voltage between the transparent electrode layer and reflecting electrode layer is omitted.

Dielectric mirror layer 121 is provided with a dielectric multi-layer film and is constituted to function as a half mirror.

Specifically, thanks to this multi-layer film structure, dielectric mirror layer 121 is constructed so as to transmit part of the incident light and to reflect the remainder. As such a dielectric, a stacked-layer construction of for example $Tio_2$ (titanium oxide) and $SiO_2$ (silicon oxide) may be employed.

Regarding the film thickness, the number of stacked layers of dielectric multi-layer film and the film thickness of the dielectric films are determined in correspondence with the resonance wavelength such that about half of the incident light is reflected and the rest is transmitted. An optical resonator in constituted by the dielectric multi-layer film and reflecting electrode. Spacing adjustment layer 122 is provided in order to adjust the 15 distance between dielectric mirror layer 121 and reflecting electrode layer 126, and is constituted of a transparent dielectric film such an $SiO_2$.

Also, if the film thickness of positive hole transport layer 124 and luminescent layer 125 are not such as to satisfy the following conditions, this spacing adjustment layer 122 could be omitted. Positive hole transport layer 124 is a layer for transporting positive holes to luminescent layer 125 when positive holes are injected from the anode constituted by transparent electrode layer 101, and consists for example of a triphenyldiamine derivatives The gap constituted by spacing adjustment layer 122 is adjusted such that the optical distance of dielectric mirror layer 12i and reflecting electrode layer 126 satisfies the condition of being an integral multiple of half wavelengths of the peak wavelength of the light emitted from this organ electroluminescent element.

In order to obtain the desired colour of emitted light, the organic electroluminescent element is constructed by adjusting the material of luminescent layer 125 and the resonator length of the resonator structure. For example, to constitute a luminescent layer 125 that emits light in the green region, a luminescent layer is constructed using a material such as aluminium tris (8-quinolilate) In this case, an organic electroluminescent element that emits light with a narrow-band luminescence spectrum in the green region, providing a peak wave length of 540 nm with a half-value width of 60 nm can be constructed.

To construct a luminescent layer 125 that emits light in the red region, a luminescent layer may be constituted using a material in which a red fluorescence chromogenic material in dispersed in aluminum trio (8-quinolilate) and/or a europium (Eu) complex. In this case, a peak wavelength of about 610 nm may be obtained. A luminescent layer containing a europium complex is disclosed in Japanese Journal of Applied Physics Vol. 34 pp. 1883–1887.

To construct a luminescent layer 125 that emits light in the blue region, a luminescent layer may be constituted using a material such as a distyrile biphenyl derivative. A technique of constituting a luminescent layer of a distyrile biphenyl derivative is disclosed in Oyo Butsuri Vol. 62, (no. 10), pp. 1016–1018 (1993).

Although in this embodiment a stacked-layer construction of luminescent layers and positive hole transport layer was employed, it would alternatively be possible to employ a stacked-layer construction of luminescent layers, positive hole transport layer and electron transport layer.

Also, it in desirable to provide a cooling mechanism in organic electroluminescent element 12 in order to cool the organic electroluminescent element.

Furthermore, separate provision of a filter that transmits light of the required wavelength and absorbs light of unrequired wavelengths on the emission side of light of the organic electroluminescent element 12 is desirable.

(Action)

An organic electroluminescent element according to the present invention emits light of specified wavelength by utilizing the optical resonance effect.

When a prescribed voltage (for example about 10 volt) in applied between transparent electrode layer 122 and reflecting electrode layer 126, an electric field is generated between the two electrode layers, and light is emitted from luminescent layer 125 in accordance with the intensity of this electric field. Some of this light passes through dielectric mirror layer 121 while the remainder is reflected. The reflected light in again reflected by reflecting electrode layer 126 and reaches dielectric mirror layer 121. At dielectric mirror layer 121, again some of the light is transmitted while the rest is reflected, so as the reflection of the light between the reflecting surface of dielectric mirror layer 121 and reflecting electrode layer 126 is repeated, and what is known an optical resonance is generated.

The wavelength of the resonating light depends on the optical distance between dielectric mirror layer 121 and reflecting electrode layer 126. if this optical distance satisfies the condition of being an integral multiple of the half wavelength of the emitted light, optical resonance is generated.

Consequently, since, of the wavelengths contained in the light that is emitted from luminescent layer 125, light that does not satisfy this condition is suppressed, only light that satisfies the aforementioned condition passes through dielectric mirror layer 121 and is emitted. Consequently, the wavelength band of the luminescence spectrum is narrower than in the embodiment described above. That is, luminescence occurs with a specific colour. This resonance effect is disclosed in detail in Applied Physics Letters, Vol. 68, (No. 19), p. 1 to 3 (1996), Applied Physics Letters, Vol 65, (No. 15), p. 1868–1870 (1994) and in Electronic Information Communication Society Technical Research Reports (Denshi Joho Tsushin Gakkai Gijutsu Xenkyu Hokoku) OME 94–79 etc. Also, technical information concerning raising the directionality in the front-side direction of an organic electroluminescent element is contained in articles in Applied Physics Letters Vol. 63, (No. 15), p. 2023–2034 etc.

With embodiment 3 as described above, an organic electroluminescent element that has strong directionality of the emitted light in the normal direction (front-side direction) of the organic electroluminescent element and whereby light emission can be restricted to a specified wavelength can be provided without using a bulky light source such as a reflector; a liquid-crystal projection device can therefore be made of smaller size than conventionally.

Also, since the organic electroluminescent element in brighter than a conventional electroluminescent element, by manufacturing such elements for the respective primary colours for colour display, and combining their images, a bright colour image can be displayed.

Embodiment 4

Embodiment 4 of the present invention relates to an organic electroluminescent element employing & polarization conversion element.

(Construction)

Figure 5:
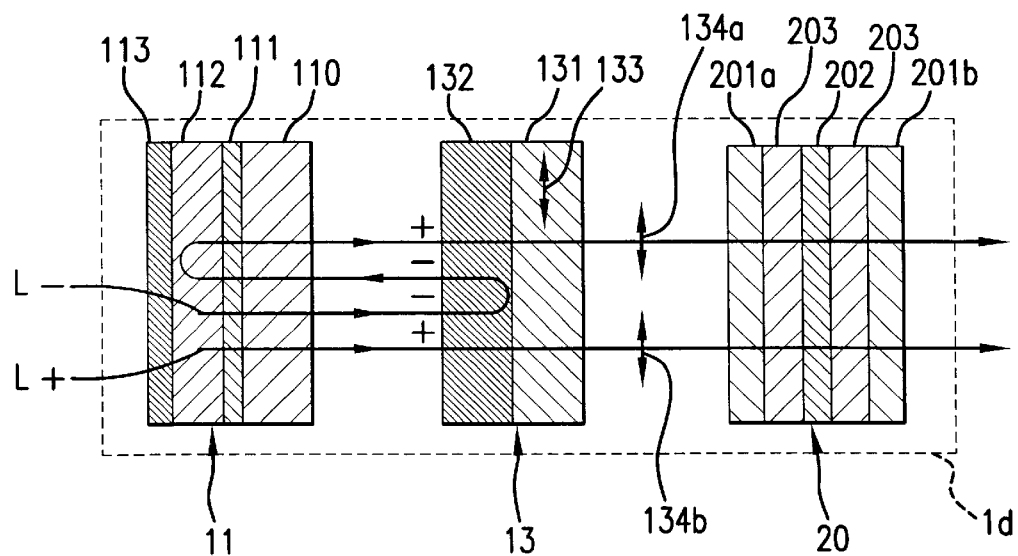
FIG. 5 is a layout diagram of a&liquid crystal display element 1d (organic electroluimnescent element 11, polarization conversion element 13 and transparent liquid crystal panel 20) according to embodiment 4.
Figure 6:
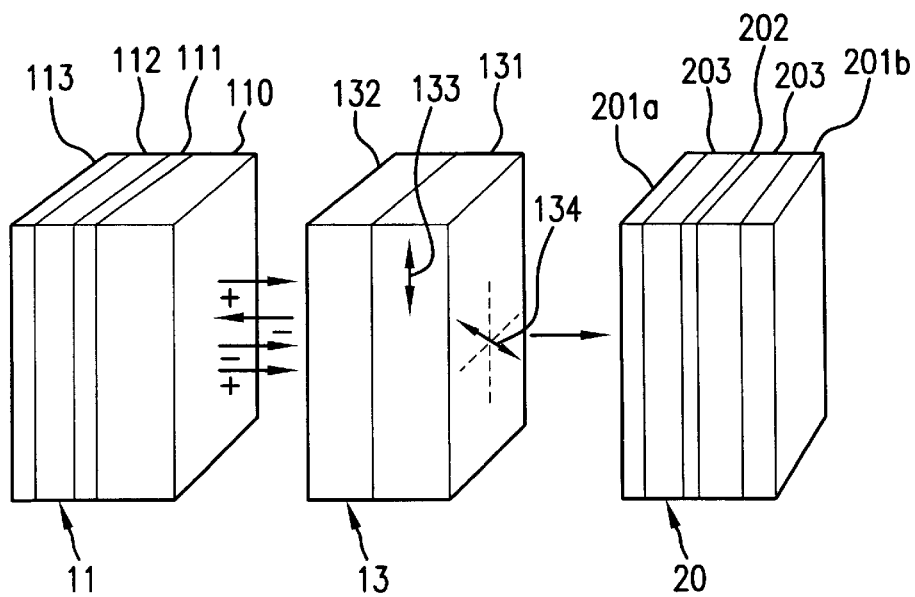
FIG. 6 is a perspective view of a liquid crystal display element 1d (organic electroluminescent element 11, polarization conversion element 13 and transparent liquid crystal panel 20) according to embodiment 4.

A liquid-crystal projection device according to embodiment 4 has practically the same construction as embodiment 1 described above (see FIG. 1) apart from liquid crystal display element 1d. As shown in FIG. 5 and FIG. 6, liquid crystal display element Id comprises an organic electroluminescent element 11, polarization conversion element 13 and transparent liquid crystal panel 20. Since organic electroluminescent element 11 is of the same construction as in the case of embodiment 2 and transparent liquid crystal panel 20 in of the same construction as in embodiment 1, further description thereof is omitted.

It should be noted that organic electroluminescent element 11 of this embodiment could be directly substituted by organic electroluminescent element 10 described in embodiment 1 or organic electroluminescent element 12 described in embodiment 3.

Also, in these Figures; in order to make the Figures easier to view, organic electroluminescent element 11, polarization conversion 20 element 13 and transparent liquid crystal panel 20 are shown an being separated by a large spatial distance. In fact, in order to supply light from electroluminescent element 11 to the liquid crystal panel in an efficient manner, these may be arranged adjacent each other without mutually intervening space or the gap between these elements may be filled with transparent material.

Polarization conversion element 13 may be constructed comprising a quarter wavelength film 131 and cholesteric liquid crystal layer 132.

Cholesteric liquid crystal layer 132 in constituted of cholesteric phase liquid crystal material; when light is directed on to this, circularly polarized light of a direction of rotation coincident with the helical direction of the cholesteric structure is reflected, whereas circularly polarized light rotating in the opposite direction to this helical direction is transmitted. For convenience in description, circularly polarized light of direction of rotation capable of being transmitted by cholesteric liquid crystal layer 132 is taken as right-handed circularly polarized light L+, while circularly polarized light of direction such as is reflected without being transmitted is taken as left-handed circularly polarized light L−.

Quarter-wavelength film 131 has an optic axis 133 parallel to the plane of the drawing and is constituted with optical anisotropy such that it converts circularly polarized light to linearly polarized light. This optic axis 133 is arranged to be parallel to one side of the rectangular external shape of polarization conversion element 13.

(Action)

The light emitted from organic electroluminescent element 11 is natural light whose direction of oscillation (polarization direction) is random and includes a clockwise polarized light component L+ and an anticlockwise polarized light component L−. Circularly polarized components in these two directions are incident on to cholesteric liquid crystal layer 132. of the circularly polarized light that is incident on cholesteric liquid crystal layer 132, right-handed circularly polarized component L+ can be transmitted through this liquid crystal layer 132. Quarter-wavelength film 131 converts incident right-handed circularly polarized light into linearly polarized light 134a oscillating in the direction that makes an angle of 45° with respect to one side of the outer rectangular shape of polarization conversion element 13 before outputting it.

In contrast, the left-handed circularly polarized component L− is reflected by this liquid crystal layer and again returned to organic electroluminescent element 11. Left-handed circularly polarized component L− that is returned to organic electroluminescent element 11 is reflected by reflecting electrode layer 113. When the circularly polarized light is reflected at the metal surface, the direction of rotation of left-handed circularly polarized component (L−) in inverted, converting it to right-handed circularly polarized component L+. light-handed circularly polarized component L+ is again input to polarisation conversion element 13. Since the direction of rotation of the circularly polarized component is now inverted to constitute circularly polarized component L+, this is transmitted through cholesteric liquid crystal layer 132 and is emitted to quarter-wavelength film 131.

At quarter-wavelength film 131, the right-handed circularly polarized light that is transmitted through cholosteric liquid crystal layer 132 is converted to linearly polarized light 134b that oscillates in a direction making an angle of 45° with respect to one side of the external rectangular shape of polarization conversion element 13, and is therefore emitted by transparent liquid crystal panel 20. In short, even through the light that is emitted from organic electroluminescent element 11 has a random polarization condition, it can be finally supplied to the transparent liquid crystal panel as linearly polarized light with the direction of polarization aligned.

If the direction of polarization of linearly polarized light 134a and 134b that is supplied to transparent liquid crystal panel 20 coincides with the direction of polarization in which polarizing plate 201a can transmit, the quantity of light that can be employed for optical modulation in the transparent liquid crystal panel can be made large.

It should be noted that the principles of a polarization conversion element constructed of a quarter-wavelength film 131 and cholesteric liquid crystal layer 132 are disclosed in Reference: Proceedings of the 15the International Display Research Conference, 1995, p. 735–738, Japanese Journal of Applied Physics, Vol. 29, (No. 4), April 1990, p. L 634–637 or Japanese Journal of Applied Physics, Vol. 29, (No. 10), October, 1990, p.1974–1984.

Since, with embodiment 4 am described above, of the light which is emitted from the organic electroluminescent element, all of the light that would otherwise fail to pass through the polarizing plate and be absorbed i.e. more than half of the light can be supplied for optical modulation by the transparent liquid crystal panel, so, ideally, an image that is twice as bright as conventionally can be projected on to the screen.

Embodiment 5

Embodiment 5 of the present invention relates to a modified example of the polarization conversion element of embodiment 4.
(Construction)

Figure 7:
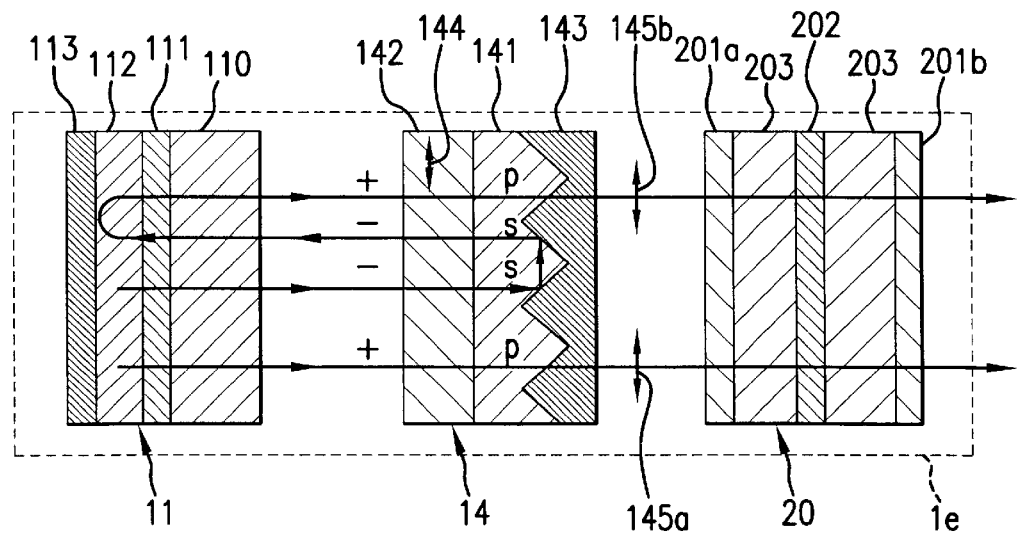
FIG. 7 is a layout diagram of a liquid crystal display element 1e (organic electroluminescent element 11, polarization conversion element 14 and transparent liquid crystal panel 20) according to embodiment 5.
Figure 8:
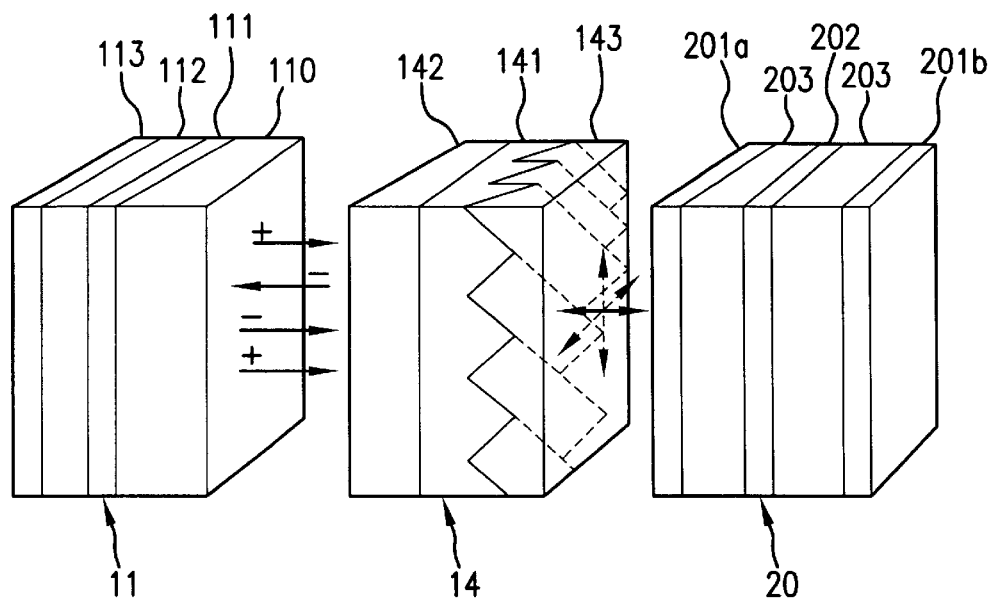
FIG. 8 is a perspective view of a liquid crystal display element 1e (organic electroluminescent element 11, polarization conversion element 14 and transparent liquid crystal panel 20) according to embodiment 5.

The liquid-crystal projection device of embodiment 5 is the same as embodiment 4 apart from liquid crystal display element 1e. As shown in FIG. 7 and FIG. 8, liquid crystal display element 1e comprises organic electroluminescent element 11, polarization conversion element 14 and transparent liquid crystal panel 20.

Organic electroluminescent element 11 and transparent liquid crystal panel 20 have the same construction as in embodiment 4, so further description thereof is omitted.

Polarization conversion element 14 comprises a micro polarization beam splitter array 141 and quarter-wavelength film 142. Micro polarization beam splitter array 141 is constructed so an to form a plurality of microprisms 143 by mutual meshing together of two members with zigzag-shaped surface irregularities. Microprisms 143 are formed such that their boundary lines form a roof shape of 45° angle with respect to the plans of the drawing. The boundary faces of microprisms 143 are formed by means of a dielectric multi-layer film structure or the like, so as to transmit light of specified polarization condition and to reflect light of polarization condition other than this. In this embodiment, for convenience in description, it will be assumed that they transmit linearly polarized light of one polarization direction (p polarization) and reflect linearly polarized light (s polarization) in the direction of polarization orthogonal to this.

Quarter-wavelength film 142 has the same construction an quarter-wavelength film 131 of embodiment 4 and has an optic axis 144 parallel to the plane of the Figure.

It should be noted that, in place of organic electroluminescent element 11 of this embodiment, there could be substituted organic electroluminescent element 10 as described in embodiment 1 or organic electroluminescent element 12 as described in embodiment 3.

In particular, the polarization separation characteristic of micro polarization beam splitter array 141 constituting polarization conversion element 14 of this embodiment shows considerable dependence on the angle of incidence of the incident light. It is therefore desirable to employ polarization conversion element 12 of embodiment 3 having an optical resonance construction in order to raise the directionality of the light incident on to micro polarization beam splitter array 141.
(Action)

As described in embodiment 4, the light that is emitted from organic electroluminescent element 11 is natural light having a random direction of oscillation and including a right-handed circularly polarized component L+ and an anticlockwise circular polarized component L−. Of the light that in emitted from organic electroluninescent element 11, the right-handed circularly polarized component L+ is converted to p polarized light by quarter-wavelength film 142 and is input to micro polarization beam splitter array 14. Since the p polarized light is capable of being transmitted by micro prisms 143, it in supplied to transparent liquid crystal panel 20 as linearly polarized light 145a in this unaltered polarization condition.

In contrast, of the light that is emitted from organic electroluminescent element 11, the left-handed circularly polarized component L− is converted to B polarized light by quarter-wavelength film 142 and is input to micro polarization beam splitter array 14. The s polarized light is reflected by microprisms 143. The boundary faces of the microprisms 143 are inclined at 45° with respect to the direction of incidence of the light, so the initial reflection changes the direction of the a polarized light to a direction at right angles to the direction of incidence and the second reflection changes its direction to the opposite direction to the direction of incidence. This reflected a polarized light in again converted to left-handed circularly polarized light L− by quarter-wavelength film 142, and is returned to organic electroluminescent element 11.

In organic electroluminescent element 11, this returned left-handed circularly polarized light L− is reflected by reflecting electrode layer 113. When left-handed circularly polarized light L− is reflected, it is converted into right-handed circularly polarized light L−. This clockwise polarized light L− is converted into p polarized light by quarter-wavelength film 142, so it now passes through microprisms 143 and is supplied to transparent liquid crystal panel 20 as linearly polarized light 145b oscillating in the same direction as linearly polarized light 145a.

In short, even though the light that is emitted from organic electroluminescent element 11 has a random polarization condition, it in finally supplied to the transparent liquid crystal panel an linearly polarized light all having the same direction of polarization.

The principles of a micro polarization beam splitter array are disclosed in society for Information Display International Symposium Digest of Technical Papers, Vol. XXXXT, 1992, pp. 427–429.

As described above, with embodiment 5, of the light that is emitted from the organic electroluminescent element, all of the light can be supplied for optical modulation by the transparent liquid crystal panel, whereas conventionally more than half of the light could not pass through the conventional polarizing plate and was absorbed; ideally, therefore, an image twice as bright as conventionally can be projected on to the screen.

Embodiment 6

Embodiment 6 of the present invention relates to a liquid crystal display device using a front-side microlens array element.

(Construction)

Figure 9:
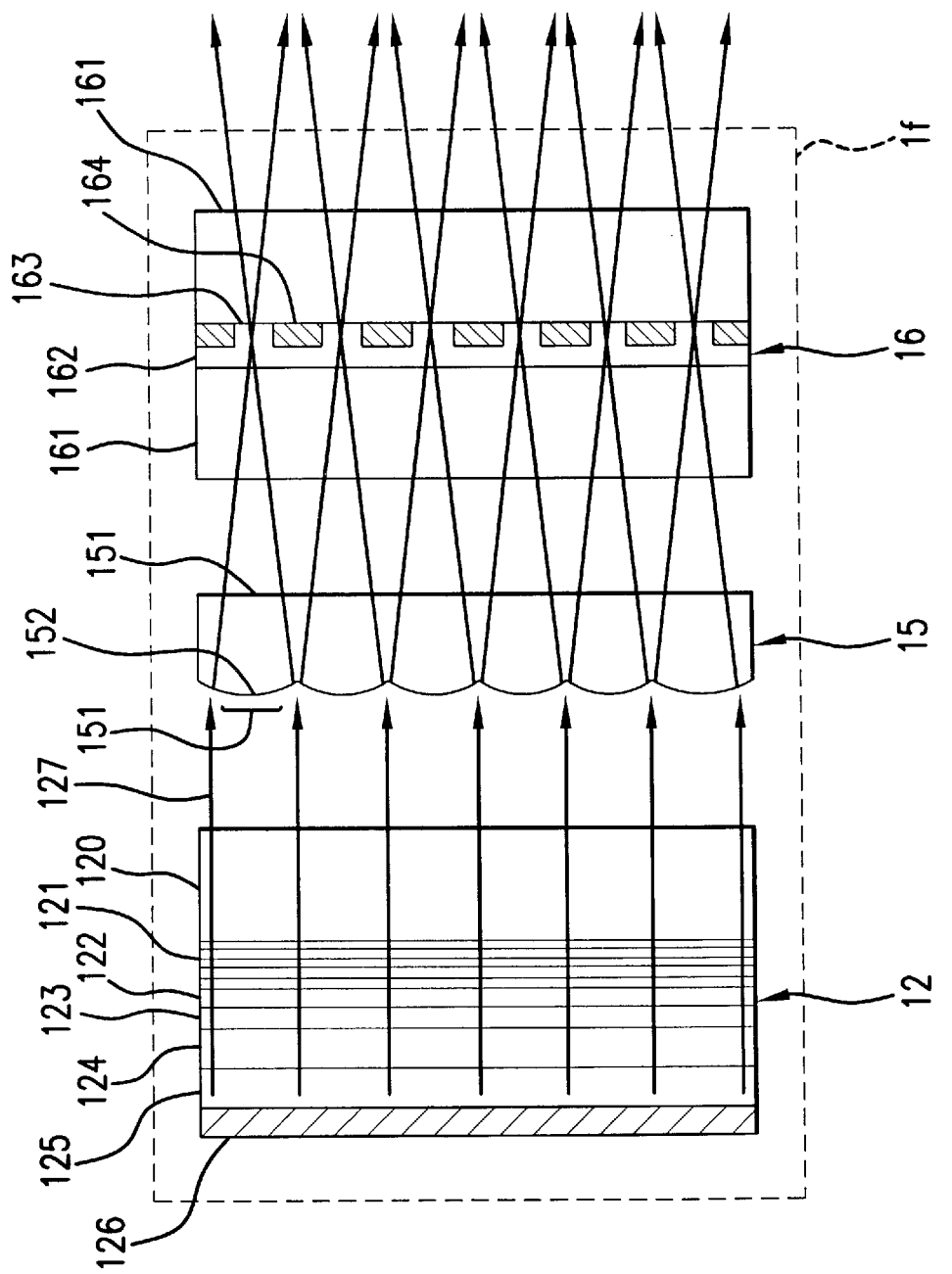
FIG. 9 in a layout diagram of a liquid crystal display element 1f (organic electroluminescent element 12, front-side microlens array element 15 and transparent liquid crystal panel 16) according to embodiment 6.

A liquid-crystal projection device according to this embodiment 6 has the same construction as embodiment 1 described above with the exception of liquid crystal display element if. As shown in FIG. 9, liquid crystal display element 1f comprises an organic electroluminescent element 12, front-side microlens array element 15, and transparent liquid crystal panel 16. organic electroluminescent element 12 has the same optical resonance construction an already described with reference to embodiment 3, so further description thereof is omitted.

Front-side microlens array element 15 is constructed by providing a plurality of microlens elements 151 arranged corresponding to the pixels of transparent liquid crystal panel 16. For example, transparent liquid crystal panel 16 comprises 640 (horizontal) ×480 (vertical) pixels, front-side microlens array element 15 also comprises 640×480 microlens elements 11. Front-side microlens array 13 is constituted by a method of manufacture such as plastic injection moulding or glass-press forming, using a mould formed with microlens elements 151 of lens surface shape. Also, the individual microlens elements 151 could be formed as diffraction lenses.

The lens surface shape of the individual microlens elements 151 is formed such as to provide a fixed focal length (for example 2.5 mm) with respect to the wavelength of the light emitted from organic electroluminescent element 12. This focal length is the rear-side focal length of microlens elements 151. The distance between front-side microlens array element 15 and transparent liquid crystal panel 16 is adjusted such that this focal length is equal to the distance from the principal point of microlens elements 151 to aperture 163 of a pixel of transparent liquid crystal panel 16. A reflection-preventing film 152 is formed on both the light input face and light output face of microlens elements 131. This reflection preventing film 152 is preferably designed such that reflectivity is lowest for light of the wavelength emitted by organic electroluminescent element 12.

Transparent liquid crystal panel 16 is constructed such that liquid crystal layers 162 are sandwiched on either side by transparent substrate 161. On one face of transparent substrate 161, there in provided an optical screening pattern 164 provided with apertures 163 for each pixel. In order to simplify the drawing, the drive circuitry and transparent electrodes etc. provided on the polarization plate (corresponding to polarization plates 201a, 201b of transparent liquid crystal panel 20 of FIG. 2) are omitted in this Figure, and the number of pixels shown is reduced. The composition of transparent substrate 161 and the liquid crystal material of liquid crystal layer 162 are the same as in embodiment 1, so further description thereof is omitted.

Optical screening pattern 164 is constituted of a material such as carbon that shows optical absorption and can be formed by printing or pasting in substrate form. Thus, of the light that is emitted to transparent liquid crystal panel 16, only light that is directed on to apertures 163 is emitted at the projection lens side, light that is directed on to optical screening pattern 164 being cut off. It should be noted that optical screening pattern 164 is not essential if the light emitted from organic electroluminescent element 12 can be completely concentrated on to apertures 163 of transparent liquid crystal panel 16 by front-side microlens array element 15.

(Action)

When a fixed DC voltage (for example about 10 volts) is applied between transparent electrode layer 122 and reflecting electrode layer 126 of organic electroluminescent element 12, light is emitted from luminescent layer 125. Then, as described with reference to embodiment 3, light of specified wavelength determined by the distance between dielectric mirror 121 and reflecting electrode layer 126 is emitted from organic electroluminescent element 12. The wavelength band of the emission spectrum of this emitted light is narrow. microlens elements 151 are designed such that the focal point in aperture 163 of transparent liquid crystal panel 16 is focused for light of this specified wavelength. In contrast, for light of other than the specified wavelength, the degree of refraction produced by the lens is different, so such light is brought to a focus either upstream or downstream in the optic axis direction with respect to aperture 163, producing a large ring of light at aperture 163.

Consequently, light of the specified wavelength passes through aperture 163 and is emitted at the projection lens side, but most of light of wavelengths other than this is either absorbed or reflected by optical screening pattern 164 and so is not emitted to the projection lens.

The greater the degree of parallelism of the light that is input to microlens array element 15, the smaller is the focal spot produced by microlens elements 151, so the amount of light that can pass through pixel apertures 163 is increased.

On the other hand, if the parallelism of the light that is input to microlens array 15 is lower i.e. it is more divergent, the light cannot be sufficiently focused by microlens elements 151 and so the focal spot becomes larger than pixel aperture 163, resulting in light being absorbed or reflected by optical screening pattern 164. The amount of light that can be transmitted through aperture 163 is thereby lowered, making the image that is projected on to the screen darker.

Consequently, use of an organic electroluminescent element having an optical resonance construction whereby the directionality of emitted light can be raised is particularly desirable in the present embodiment employing a microlens array element, in order to increase the amount of light that can pass through the pixels of the liquid crystal panel.

It should be noted that, if a microlens array element 15 were not used, light absorbed or reflected by optical screening pattern 164 would be unable to pass through the liquid crystal panel, so the image projected on to the screen would be dark.

As described above, with this embodiment 6, since an organic electroluminescent element having a resonance construction of excellent directionality is employed for the emitted light, this can be focused on to the pixel apertures of the liquid crystal panel by the microlens array element, enabling the amount of light that can be transmitted through the pixel apertures to be increased; colour display of high brightness and colour purity can thus be achieved with the liquid-crystal projection device for colour display.

Embodiment 7

Embodiment 7 of the present invention relates to a liquid crystal display device further employing a rear-side microlens array element.
(Construction)

Figure 10:
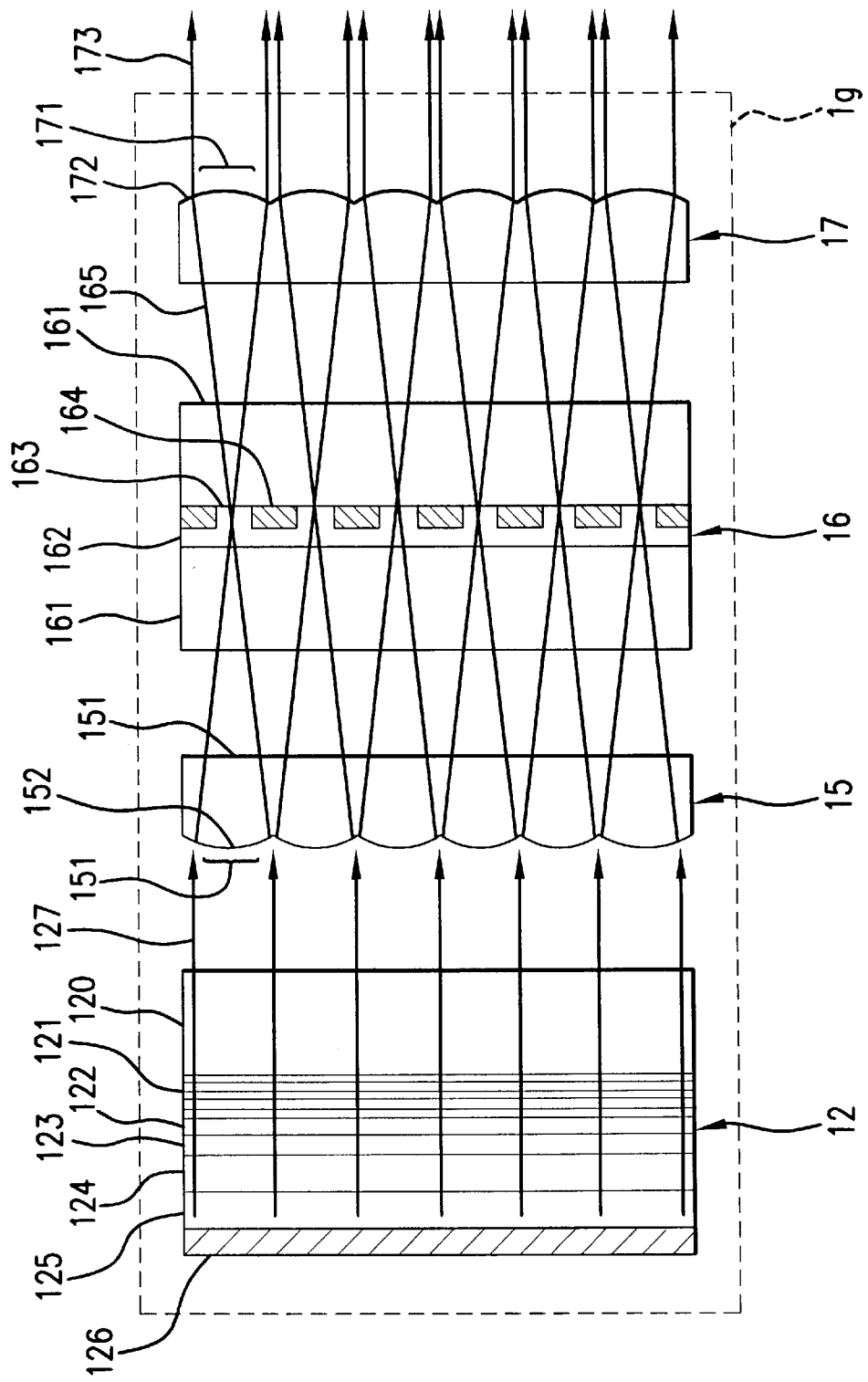
FIG. 10 is a layout diagram of a liquid crystal display element 1g (organic electroluminescent element 12, front-side microlens array element 15, transparent liquid crystal panel 16 and rear-side microlens array element 17) according to embodiment 7.

A liquid-crystal projection device according to the seventh embodiment has the same construction a embodiment 6 described above apart from liquid crystal display element 1g. An shown in FIG. 10, liquid crystal display element 1g is constituted comprising an organic electroluminescent element 12, front-side microlens array element 15, transparent liquid crystal panel 16 and rear-side microlens array 17. organic electroluminescent element 12, front-side microlens array element 15 and transparent liquid crystal panel 16 are the same as described in embodiment 6, so further description thereof is omitted.

Rear-side microlens array element 17 is constituted comprising a plurality of microlens elements 171 arranged corresponding to the pixels of transparent liquid crystal panel 16. For example, if transparent liquid crystal panel 16 is constituted of 640 (horizontal)×480 (vertical) pixels, rear-side microlens element 17. is likewise constituted of 640×480 microlens elements 171.

Rear-side microlens array element 17 is constructed. by a method of manufacture such as plastic injection moulding or glass press forming, using a mould formed with lens surface shapes of microlens elements 171. Alternatively, microlens elements 171 could be constructed by diffraction lenses. The lens surface shape of the individual microlens elements 171 is formed such as to provide a fixed focal length (for example 2.5 mm) for light of the specific wavelength emitted by organic electroluminescent element 12.

This focal length is the front focal length of microlens element 171. The distance between transparent liquid crystal panel 16 and rear-side microlens array element 17 is adjusted such that this focal length is equal to the distance from pixel elements 163 of transparent liquid crystal panel 16 to the principal point of microlens element 171. For example, if the focal length on the rear side of front microlens array element 15 and the focal length on the front side of rear microlens element 17 are met to the same distance, the distance between front microlens array element 15 and pixel aperture 163 and the distance between rear microlens array element 17 and pixel aperture 163 are arranged to be the same.

A reflection-preventing film 172 in formed on both the optical input face and optical output face of rear microlens element 171.

Preferably reflection-preventing film 172 is designed much as to provide lowest reflectivity in respect of the wavelength of the light that is admitted by organic electroluminescent element 12.
(Action)

As described above in embodiment 6, light that is input to transparent liquid crystal panel 16 is brought to a focal point at pixel aperture 163 and then constitutes divergent light 165. Microlens elements 171 of rear-side microlens array element 17 are designed such that their front-side focal length is equal to the distance of aperture 163. Divergent light 165 is therefore again converted into parallel light by this microlens array element 17.

Since, as described above, with this seventh embodiment, the rear-side microlens array element suppresses divergence of the light passing through liquid crystal panel 16, a liquid-crystal projection device can be provided that is capable of projecting an even brighter image.

Embodiment 8

The eighth embodiment of the present invention relates to a liquid crystal display device employing both a polarization conversion element and a microlens array element.
(Construction)

Figure 11:
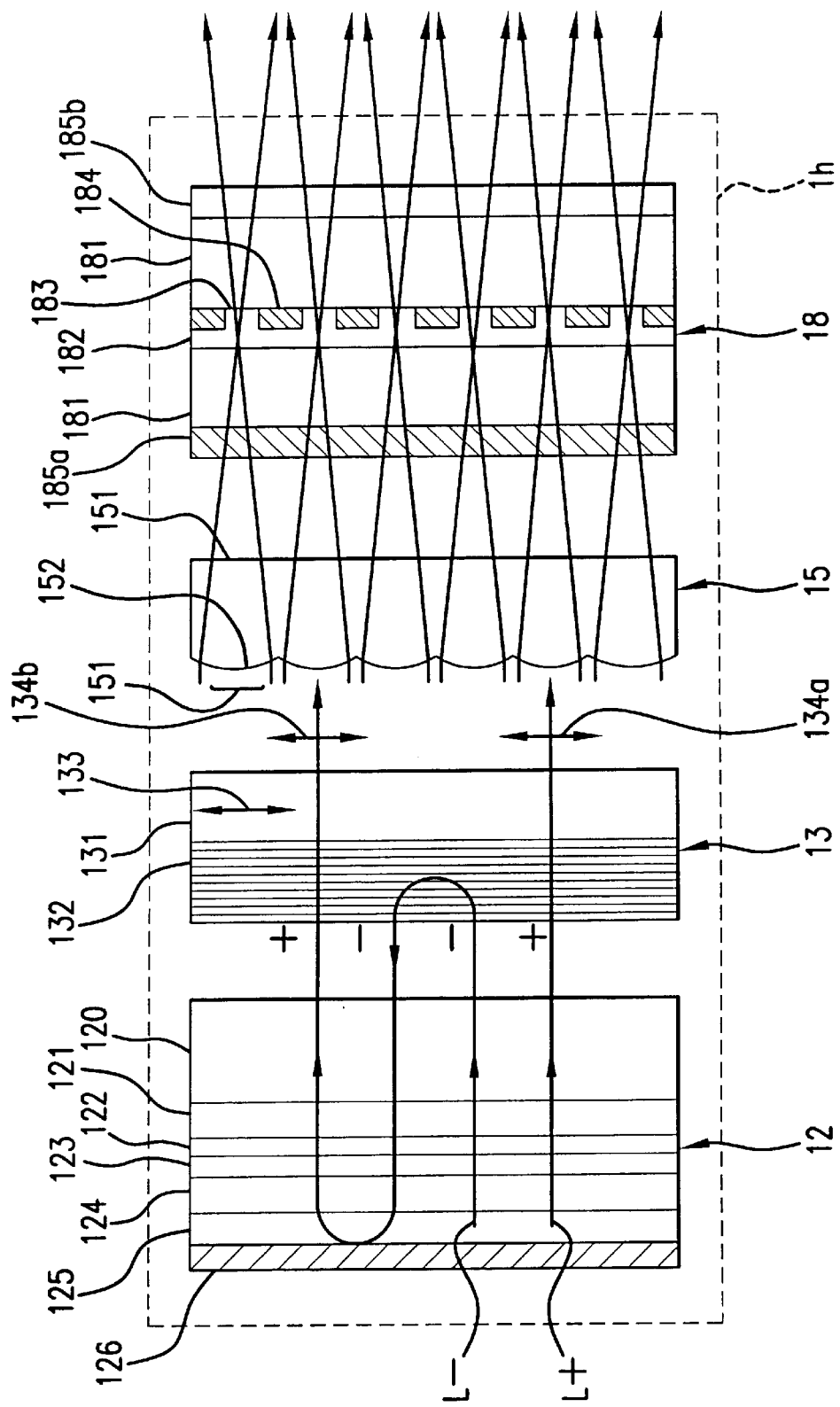
FIG. 11 is a layout diagram of a liquid crystal display element 1h (organic electroluminescent element 12, polarization conversion element 13, front-side microlens array element 15 and transparent liquid crystal panel 18) according to embodiment 8.

A liquid-crystal projection device according to embodiment 8 has the same construction as embodiment 1 described above apart from liquid crystal display element 1h. As shown in FIG. 11, liquid crystal display element 1h comprises an organic electroluminescent element 12, polarization conversion element 13, front-side microlens array element 15 and transparent liquid crystal panel 18.

Organic electroluminescent element 12 has the same optical resonant construction as that described in embodiment 3; polarization conversion element 13 is the same an described in embodiment 4; and front-side microlens array element 15 is of the same construction as described in embodiment 6; further description thereof in therefore omitted.

Transparent liquid crystal panel 18 is constituted comprising two transparent substrates 181, liquid crystal layer 182 and polarizing plates 185a and 185b. on one of the liquid crystal layer sides of transparent substrate 101, there is provided an aperture 183 for each pixel and a screening pattern 184 in provided around its periphery. Since transparent substrate 181, aperture 183 and optical screening pattern 184 ore respectively the same as transparent substrate 161, aperture 163 and screening pattern 184 of transparent liquid crystal panel 16 of embodiment 6, description thereof is omitted. In order to facilitate understanding of the drawing, just an in the case of embodiment 1, the drive circuit provided on the transparent substrate and the display circuit etc. for supplying control signals to the transparent electrodes, wiring and drive circuit are not shown.

As liquid crystal layer 182, a known twisted nematic liquid crystal or the like is employed; this is arranged such that in the condition in which voltage is applied it does not rotate the plane of polarization of the incident light but in the condition when voltage is not applied it does rotate the plane of polarization of incident light.

Polarizing plates 185a and 185b have the same construction and are arranged such as to transmit only light of a specified polarization condition of the incident light. However, the direction of polarization of light transmitted by polarizing plate 185b is arranged to be offset by a certain angle with respect to the direction of polarization of transmission by polarizing plate 185a.

This angle is met to be equal to the angle of rotation of the plane of polarization that is produced when the plane of polarization of incoming light is rotated when no voltage is applied to liquid crystal layer 182.

Also, the direction of polarization of linearly polarized light emitted from polarizing conversion element 13 is arranged to coincide with the direction of polarization capable of being transmitted by polarizing plate 185a. Furthermore, the distance between the principal point of microlens element 151 of front-side microlens array element 15 and aperture 183 of transparent liquid crystal panel 18 is set to be equal to the rear-side focal length of microlens element 151.

For convenience in description, it is assumed that circularly polarized light of the direction of rotation that is capable of being transmitted by cholesteric liquid crystal layer 132 is right-handed circularly polarized light L+, while the circular polarization of direction of rotation that is reflected without being transmitted in left-handed circularly polarized light L−.

(Action)

The wavelength region of light that is emitted from organic electroluminescent element 12 is restricted by the optical resonance structure (see embodiment 3). However, the direction of oscillation of the light is random and includes both a right-handed circularly polarized component L+ and an left-handed circularly polarized component L−. Circularly polarized components in both these directions are input to cholesteric liquid crystal layer 132. Since, of the circularly polarized components that are input to cholesteric liquid crystal layer 132, right-handed circularly polarized component L+ can be transmitted through this liquid crystal layer 132, it is input to quarter-wavelength film 131. Quarter-wavelength film 131 converts right-handed circularly polarized incoming light into linearly polarised light 134a oscillating in a direction that makes an angle of 45° with respect to one side of the external rectangular shape of polarization conversion element 13. on the other hand, left-handed circularly polarized component L− is reflected by this liquid crystal layer and is returned once more to organic electroluimnescent element 12. Left-handed circularly polarized component L− that has returned to organic electroluminescent element 12 reaches reflecting electrode layer 126, where it is reflected. When the circularly polarized light in reflected, left-handed circularly polarized light component L− has its direction of rotation reversed and becomes right-handed circularly polarized light component L+.

Right-handed circularly polarized component L+ is again input to polarization conversion element 13. This time, since the circularly polarized component has been reversed in direction of rotation, becoming right-handed circularly polarized component L+, it is able to pass through cholesteric liquid crystal layer 132 and is emitted to quarter-wavelength film 131.

Quarter-wavelength film 131 converts the right-handed circularly polarized light that has passed through cholesteric liquid crystal layer 132 to linearly polarized light 134b making an angle of 45° with respect to one side of the rectangular external shape of the polarization conversion element and oscillating in the same direction as the direction of oscillation of linearly polarized light 134a; this linearly polarized light 134b is then output to transparent liquid crystal panel 18.

In short, whatever the polarization condition of the light that is emitted from organic electroluminescent element 12, the light that is supplied to transparent liquid crystal panel 18 is aligned in direction of oscillation and close to parallel.

Since, in this embodiment, an organic electroluminescent element having a resonator structure is employed as light source, the wavelength band of the emission spectrum of the emitted light is narrowly defined. The polarization selective reflection function of the polarization conversion element and the optical characteristics of the microlens array element can therefore be optimized for this specific wavelength region only.

The wavelength dependence of the polarization selective reflection function of the polarization conversion element is determined, in the case of the polarization conversion element in embodiment 4, by the helical period of cholesteric liquid crystal layer 132 and, in the case of the polarization conversion element in embodiment 5, is determined by the layer-stacking period of the dielectric multi-layer film.

In attempting to confer a polarization selective reflection function in a wavelength region including red, green and blue, the need therefore arises to superimpose in multiple stages helical periodical structures or stacked-layer periodical structures corresponding to each primary colour in each of the polarization conversion elements. However, the construction of the polarization conversion element is straightforward in that, when constructing polarization conversion elements functioning only in respective specified wavelength regions such as red, green or blue, it suffices to provide a helical periodical structure or stacked-layer periodical structure corresponding just to that wavelength region.

Microlens elements 151 constituting front-side microlens array element 15 focus light from polarization conversion element 13 on to apertures 183 or transparent liquid crystal panel 18.

The direction of polarization of linearly polarized light 134a and 134b supplied to transparent liquid crystal panel 20 coincides with the direction of polarization that is capable of passing through polarizing plate 185a. This linearly polarized light 134a and 134b therefore passes through polarizing plate 185a and is focused on to pixel aperture 183.

When no electric field is applied to liquid crystal layer 192, liquid crystal layer 182 rotates the plane of polarization of incident light by a fixed angle. And when an electric field is applied to liquid crystal layer 182, the liquid crystal molecules are aligned in the direction of the electrical field and no polarization plane rotation is applied to incident light.

Consequently, in the case of pixels to which voltage is not applied, the plane of the incident light is rotated, allowing the light to pass through polarizing plate 185b and to be output at the projection lens side. In contrast, in the case of pixels to which voltage is applied, no rotation in applied to the plane of polarization of the incoming light which therefore cannot pass through polarizing plate 185b and is absorbed or reflected.

As described above, with this embodiment 8, thanks to the organic electroluminescent element, intense light of a specified wavelength and excellent directionality is extracted, the direction of polarization is aligned by means of the polarization conversion element, and the amount of light that can pass through the pixel apertures is increased by the microlens array element; a liquid-crystal projection device whereby a bright projected image can be obtained can therefore be provided.

Embodiment 9

Embodiment 9 of the present invention relates to a liquid-crystal projection device of a mode wherein an image projected on to a screen can be observed from the rear.

(Construction)

Figure 12:
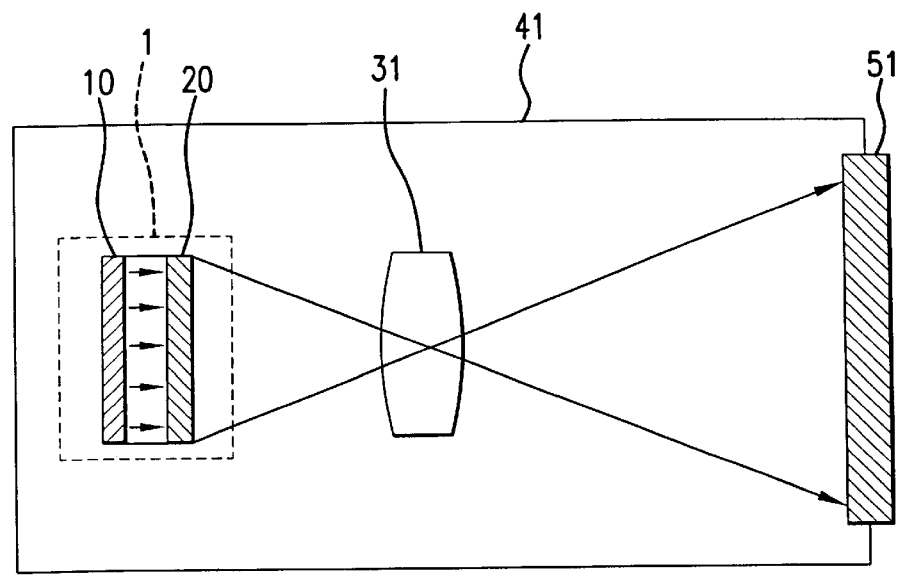
FIG. 12 is an overall layout diagram of a liquid-crystal projection device according to embodiment 9.

As shown in FIG. 12, a liquid-crystal projection device according to the present invention comprises a liquid crystal display element 1, projection lens 31, frame 41 and screen 51.

The liquid crystal display elements 1a, 1b, 1c, 1d, 1e, 1f, 1g and 1h of embodiments 1 to 8 can be applied to liquid crystal display element 1. In other words, organic electroluminescent element 10 and transparent liquid crystal panel 20 in this Figure are shown by way of example and the optical elements of the foregoing embodiments could be applied in place of these.

Projection lens 31 is constructed such that an image that is output from liquid crystal display element 1 is focused on screen 51. Only one projection lens is shown in the Figure, but this could of course be constituted by an assembly of a plurality of lenses.

Specifically, this is constituted such that an image emitted from liquid crystal display element 1 is brought to a focus on screen 51 after magnification etc.

However, if a liquid crystal display element 1f according to embodiment 6 or a liquid crystal display element 1h according to embodiment 8 is employed, the output light is divergent light. Projection lens 31 is therefore adjusted such that this divergent light in brought to a focus on screen 51.

Also, in this embodiment, the image is observed from the rear side of the screen, so the image that is projected on to screen 51 must be inverted compared with embodiment 1. Projection lens 31 is therefore constructed so as to invert the projection image before displaying it.

Frame 41 is constructed such that liquid crystal display element 1, projection lens 31 and screen 51 can be arranged at suitable distances.

In order to enable the image that is projected on to the screen to be observed from behind the screen, screen 51 is constructed of for example a semi-transparent film or a resin plate having a Fresnel lens.

(Action)

The image that is output from liquid crystal display element 1 is focused on to screen 51. The observer observes the image displayed on screen 51 from the rear.

For example, if the diagonal size of liquid crystal display element 1 is assumed to be 33 mm (1.3 inches) and the magnification factor of projection lens 31 is assumed to be about 12 times, the image displayed on screen 51 will be of diagonal size 400 mm (15.6 inches). With this embodiment 9 as described above, an image in projected on to a transparent screen using a liquid crystal display element according to the present invention, so a projected image can be provided that is brighter than with a device using a conventional electroluminescent element.

Embodiment 10

Embodiment 10 of the present invention provides a liquid-crystal projection device for colour display use.
(Construction)

Figure 13:
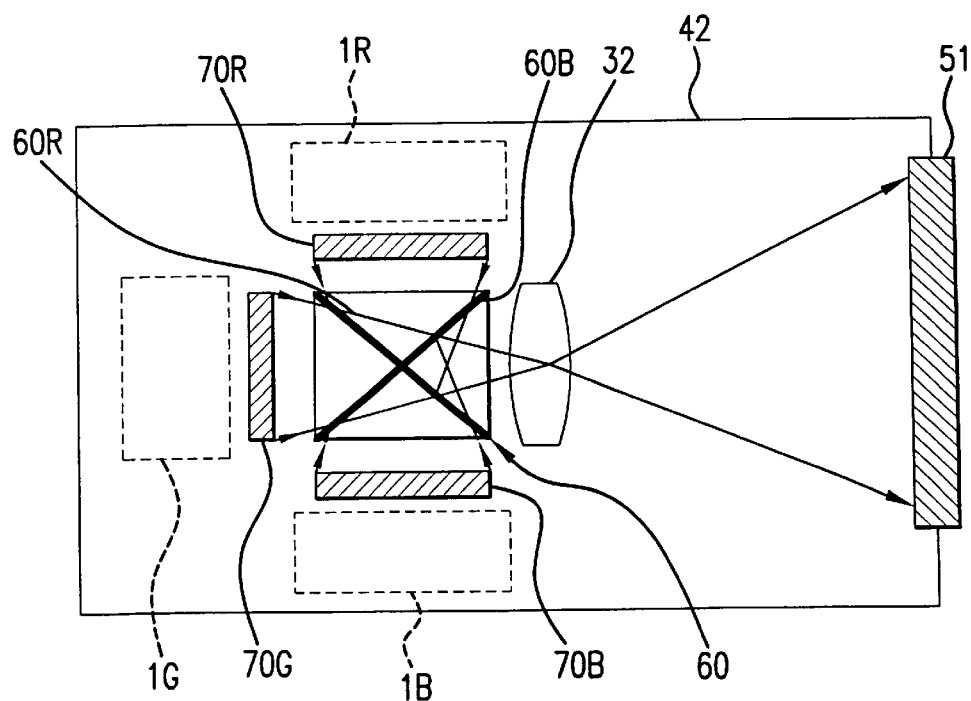
FIG. 13 is an overall layout diagram of a transparent liquid crystal display element according to embodiment 10.

As shown in FIG. 13, a liquid-crystal projection device according to this embodiment comprises a red liquid crystal display element 1R, a green liquid crystal display element 1G, a blue liquid crystal display element 1a, a red wavelength film 70R, a green wavelength film 70G, a blue wavelength film 70B, a dichroic prism 60, a projection lens 32, a frame 42 and screen 51. Hereinbelow, of the three primary colours employed in this embodiment, optical elements relating to red colour are denoted by affixing the suffix R, optical elements relating to green colour by the suffix G, and optical element relating to blue colour by the suffix 9, respectively. As liquid crystal display elements 1R, 1G and 1B, there are applied liquid crystal display elements respectively equipped with an organic electroluminescent element that emits light of red colour, an organic electroluminescent element that emits light of green colour or an organic electroluminescent element that emits light of blue colour, as light source.

However, the degree of refraction by projection lens 32 must be varied, since the emitted light shows some degree of divergence when 1f and 1h including a front-side microlens array element (reference numeral 15 in FIG. 9) are applied to a liquid crystal display element.

Also, a liquid crystal display element is employed in which the wavelength of the emitted light is adjusted when 1c, 1f, 1g and 1h including organic electroluminescent elements (reference numeral 12 in FIG. 4 and FIG. 9 to FIG. 11) having an optical resonance structure are applied in the liquid crystal display element. Specifically, in the came of liquid crystal display element 1R, the wavelength region of the emitted light of organic electroluminescent element 12 is set to red. As in the case of liquid crystal display element 1G, the wavelength region of the emitted light of organic electroluminescent element 12 is met to green. And in the came of liquid crystal display element 1B, the wavelength region of the emitted light of organic electroluminescent element 12 is set to blue.

Specifically, the distance between dielectric mirror layer 121 and reflecting electrode layer 126 in adjusted after selecting the material of luminescent layer 125 of organic electroluminescent element 12. Although, if polarisation conversion element 13 of embodiment 4 or polarization conversion element 14 of embodiment 5 it employed, a polarization conversion element could be employed having a polarization selective reflection function over the entire visible light region, use of a polarization conversion element having a polarization selective reflection function for a specific wavelength region only enables the efficiency of utilization of light to be improved.

Also, if a microlens array element (15, 17) in employed, the lens is designed such as to reduce aberration when light of that colour is input. Furthermore, the reflection preventing film (152, 172) of the microlens element is adjusted such that its reflectivity is lowest when light of that colour is input. For example, adjustment is effected so as to satisfy the aforementioned condition in respect of light of wavelength 610 nm in the came of liquid crystal display element 1R, in respect of light of wavelength 535 nm in the case of liquid crystal display element 1G, and with respect to light of wavelength 470 nm in the case of liquid crystal display element 1B.

Wavelength films 70 are constructed using a glass plate or plastics plate. Red wavelength film 70R is constructed so as to be capable of transmitting light of red wavelength. Green wavelength film 70G is constructed so as to be capable of transmitting light of green wavelength. Blue wavelength film 70B is constructed so as to be capable of transmitting light of blue wavelength. Wavelength films 70R, 70G and 70B can be removed from the structural elements. Dichroic prism 60 is constructed to be capable of combining the images from liquid crystal display elements 1R, 1G and 1B. In more detail, dichroic prism 60 is constituted by assembling a plurality of prisms, formed with dielectric multilayer films that reflect light of a specific wavelength at their boundary faces. For example, film 60R is constituted to reflect light of red wavelength and to transmit light of other wavelength. Film 60B is constituted to reflect light of blue wavelength and to transmit light of other wavelengths.

Projection lens 32 is adjusted to be capable of projecting a combined image from dichroic prism 60 on to screen 51. While only one lens is shown in the Figure, it could be constructed of a plurality of lenses.

Frame 42 is constructed with a volume capable of containing all the optical elements of this embodiment.

Screen 51 is the same as that described with reference to embodiment 9.
(Action)

The images that are supplied from liquid crystal display elements 1R, 1G and 1B through wavelength films 70R, 70G and 70B to dichroic prism 60 are images of light of the respective primary colours. The red light is reflected by film 60R of dichroic prism 60. The blue light is reflected by film 60B of dichroic prism 60. The green light is reflected by neither film 60R nor 60B and passes through both films. As a result, an image obtained by combination of the light of these three colours is emitted on the projection lens 32 side of dichroic prism 60. This image in magnified and projected on to screen 51 by projection lens 32. The image projected on to screen 51 can be observed by an observer from the rear side. For example, if the transparent liquid crystal panel is constituted with a diagonal size of about 63.5 mm (2.5 inches), rear projection screen 51 is formed with a diagonal size of about 1 m (about 40 inches).

As described above, with this embodiment 10, liquid crystal display elements according to the present invention are provided for each primary colour and these are combined to produce a colour image, so, compared with the case where illumination is effected with a single organic electroluminescent element emitting white light, a brighter colour image can be displayed.

Embodiment 11

Figure 14:
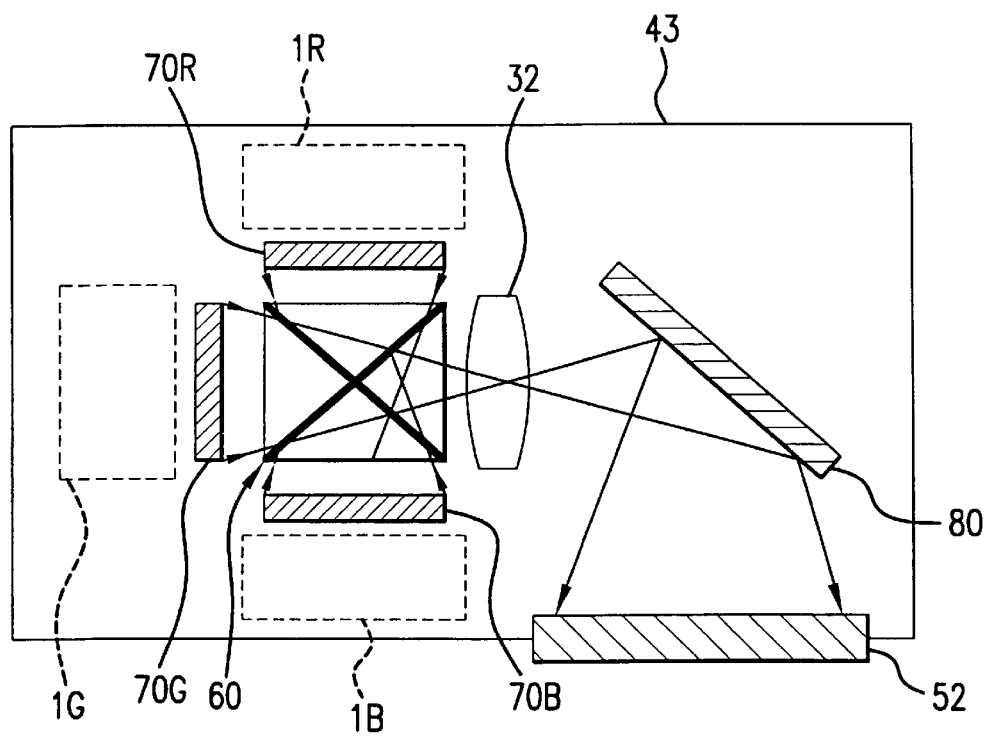
FIG. 14 is an overall layout diagram of a liquid-crystal projection device according to embodiment 11.

Embodiment 11 of the present invention provides a construction of a liquid-crystal projection device for colour display different from embodiment 10.
(Construction)
As shown in FIG. 14, a liquid-crystal projection device according to this embodiment has practically the same construction as the liquid-crystal projection device of embodiment 10. However, the liquid-crystal projection device of this embodiment is further provided with a reflecting mirror 80. It also differs from embodiment 10 in that there is provided a screen 52 in place of screen 51 of embodiment 10, and this is stored in frame 43. Reflecting mirror 80 is constructed so as to be capable of reflecting light from projection lens 32 in a direction at right angles with respect to the optic axis.

Screen 52 in constructed so as to be capable of projecting the image reflected by reflecting mirror 80 such that it can be observed from the back face.

Frame 43 is constructed so as to be capable of arranging the various optical elements such that an image of suitable size can be formed on screen 52.
(Action)
This is the same as in the case of embodiment 10 as far as the emission from projection lens 32 of a combined image obtained by combining images of the respective primary colours. This combined image is reflected by reflecting mirror 80 and is projected on to screen 52. In order to project an image of the same magnification as in embodiment 10, the distance on the optic axis from projection lens 32 to screen 52 can be made equal to the distance from projection lens 32 to screen 51 in embodiment 10.

With this embodiment 11, liquid crystal display elements according to the present invention are provided for each primary colour and these are combined to generate a colour image, so a bright colour image can be displayed.

Also, there is the advantage that, if a convex-surfaced mirror in provided am the reflecting mirror, the image is further magnified by this reflection, so large image magnification can be obtained even if the distance on the optic axis is short.

Also, since the image produced by reflection by the reflecting mirror can be inverted, if the image that in emitted from the projection lens was inverted, this further inversion of the image enables it to be corrected to a non-inverted image.

Embodiment 12

Embodiment 12 of the present invention provides a liquid-crystal projection device for colour display different from that of embodiment 10.

Figure 15:
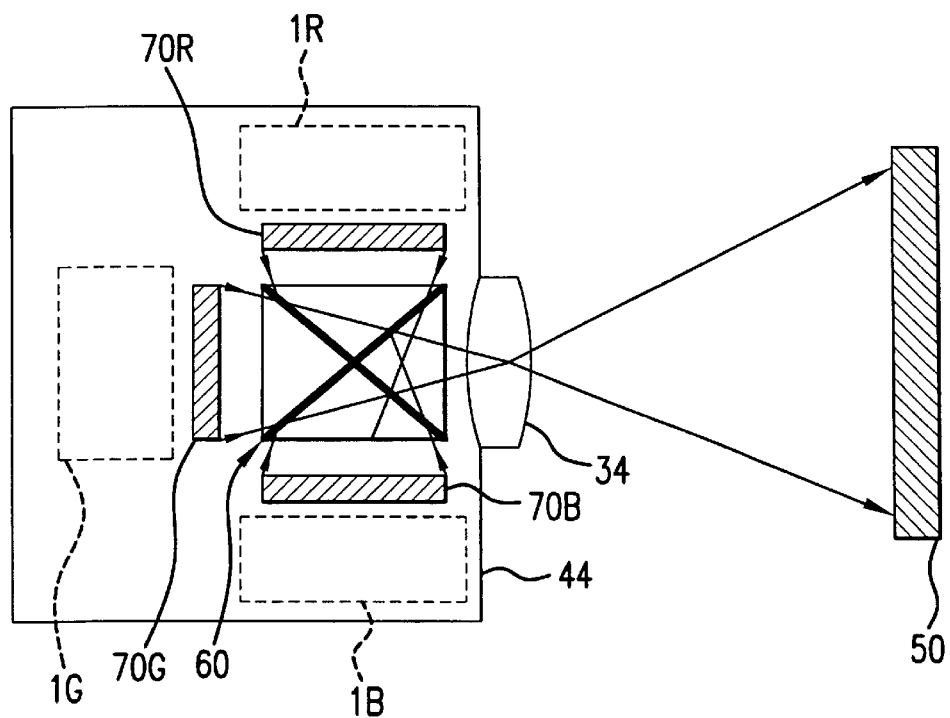
FIG. 15 is an overall layout diagram of a liquid-crystal projection device according to embodiment 12.

(Construction)
As shown in FIG. 15, the construction of a liquid-crystal projection device according to this embodiment is practically the same as that of a liquid-crystal projection device according to embodiment 10. However, a liquid-crystal projection device according to this embodiment differs from embodiment 10 in that, instead of a screen being incorporated within the frame as in embodiment 10, an external screen 50 in arranged to be capable of being projected on to. Projection lens 34 is arranged to be capable of projecting a combined image on to external screen 50. In this Figure, it is constituted by a single projection lens, but an assembly of a plurality of lenses could be used. In particular, the distance with respect to the screen for projection on to an external screen is not fixed. It is therefore constructed so as to focus at whatever distance screen 50 is arranged.

Since frame 44 does not contain a screen within the frame, it is constructed so as to be able to contain liquid crystal display element 1, wavelength film 70, dichroic prism 60 and projection lens 34.
(Action)
In this embodiment, light that is emitted from projection lens 34 is projected on to a screen arranged outside. The magnification factor of the image varies depending on the construction of the lens of projection lens 34 and the distance between projection lens 34 and screen 50.

As described above, with this embodiment 12, a liquid-crystal projection device can be provided which does not incorporate a screen.

Other Embodiments

It should be noted that, although, in the present embodiments, a flat plate-shaped transparent liquid crystal panel was employed, so the organic electroluminescent elements were also made in the form of a flat plate so as to illuminate this liquid crystal panel evenly, if the display surface of the liquid crystal panel were for example curved, the organic electroluminescent elements could also be deformed so as to match the surface shape of the liquid crystal panel.

Also, so long as the front-side microlens array element, rear-side microlens array element, polarization conversion element and transparent liquid crystal panel can provide the functions sot out in the embodiments, other constructions of these could be employed.

INDUSTRIAL APPLICABILITY

Since, with the present invention, a flat plate-shaped organic electroluminescent element is employed whereby a larger amount of light can be obtained with lower drive voltage than with the conventional light source using inorganic material, a liquid-crystal projection device of small size can be provided whereby a brighter image than conventionally can be projected.

Also, according to the present invention, if an organic electroluminescent element is employed having a resonator structure that emits light with better directionality of the emitted light than conventionally to the liquid crystal panel, diminution of the quantity of light due to divergence of the light can be prevented, making It possible to provide a liquid-crystal projection device of small size and that can be driven with low voltage and whereby a bright image can be projected.

Since, according to the present invention, a polarization conversion element is employed that can convert the polarization condition of emitted light, a liquid-crystal projection device whereby a bright image can be projected can be provided, by increasing the amount of light that can pass through the polarizing plate of the liquid crystal panel.

According to the present invention, since, in projection of a colour image, a polarization conversion element is employed that functions in a specified wavelength band, the amount of light that can pass through the polarizing plate of the liquid crystal panel is increased, enabling a liquid-crystal projection device of small size to be provided whereby a bright image can be projected.

Use of a microlens array element whereby light is focused on to the pixel apertures of the liquid crystal panel according to the present invention increases the amount of light that can pass through the pixel apertures, thereby enabling a liquid-crystal projection device of small size to be provided whereby a bright image can be projected.

In the projection of a colour image according to the present invention, use of a small luminescent element whereby, due to optical resonance, only light of specific wavelength is emitted increases the amount of light of specific wavelength thereby enabling a liquid-crystal projection device of small size to be provided whereby a bright image can be projected.

What is claimed is:

1. A liquid-crystal projection device having a liquid crystal display element, comprising:

a liquid crystal panel having a polarization plate;

an organic electroluminescent element having an organic thin-film layer containing organic molecules that emit a light disposed between a reflecting electrode layer that reflects the light and a transparent electrode layer that transmits the light, wherein a half-mirror layer is provided on an optical output side of the transparent electrode layer, the half-mirror layer reflecting a first portion of the emitted light back through the transparent electrode layer into the reflecting electrode layer, while transmitting a second portion of the emitted light, a distance between the half-mirror layer and the reflecting electrode layer being set to an optical distance that produces a resonance of the emitted light;

a transparent liquid crystal panel that controls transmission of light emitted from) a face of the organic electroluminescent element; and a polarization conversion element disposed between the organic electroluminescent element and the transparent liquid crystal panel, the polarization conversion element converting a polarization of emitted light from the organic electroluminescent element, and the transparent liquid crystal panel including a polarizing plate that transmits light of a specified polarization, of the light emitted after passing through the polarization conversion element, a direction of polarization of light, provided through the polarization conversion element to the liquid crystal panel, being substantially consistent with a permeable direction of polarization of light in the polarizing plate of the liquid crystal panel.

2. The liquid-crystal projection device according to claim 1, the organic thin-film layer comprising a white luminescent layer that emits white light.

3. The liquid-crystal projection device according to claim 1, the organic thin-film layer comprising successively stacked primary color luminescent layers that respectively emit light of respective wavelength regions of a plurality of primary colors necessary for color display.

4. The liquid-crystal projection device according to claim 1, the organic electroluminescent element comprising a transparent electrode layer overlying a transparent substrate, the organic thin-film layer overlying the transparent electrode layer and an electrode layer overlying the organic thin-film layer, the electrode layer reflecting light emitted by the organic thin-film layer.

5. The liquid-crystal projection device according to claim 1, the polarization conversion element comprising:

a circular polarization selective reflection filter arranged on an organic electroluminescent element side and that reflects one circularly polarized component of right-handed circularly polarized light and left-handed circularly polarized light and that transmits other circularly polarized components; and a ¼ wavelength plate that converts circularly polarized light to linearly polarized light and that converts linearly polarized light to circularly polarized light.

6. The liquid-crystal projection device according to claim 1, the polarization conversion element comprising:

a linearly polarized light selective reflection filter arranged on a transparent liquid crystal panel side and that, of two perpendicular linearly polarized components, reflects one linearly polarized component and transmits the other linearly polarized component; and a ¼ wavelength plate that converts circularly polarized light into linearly polarized light and that converts linearly polarized light into circularly polarized light.

7. The liquid-crystal projection device according to claim 1, the polarization conversion element comprising a polarization selective reflection filter that, for the emitted light of a specified wavelength region, transmits light of a specified polarization and reflects light of other polarizations.

8. The liquid-crystal projection device according to claim 1, further comprising a front-side microlens array element disposed between the organic electroluminescent element and the transparent liquid crystal panel, the front-side microlens array element including microlens elements that collect output light from the organic electroluminescent element and are arranged corresponding to individual pixels of the transparent liquid crystal panel.

9. The liquid-crystal projection device according to claim 8, a focal length of the microlens elements and a distance between the front-side microlens array element and the liquid crystal panel being such that apertures of the individual pixels of the transparent liquid crystal panel are arranged in a vicinity of a rear-side focal point of the microlens elements.

10. The liquid-crystal projection device according to claim 8, the transparent liquid crystal panel comprising an optical screening element that transmits light that is incident on an aperture of each pixel and that screens light that is incident on portions other than the aperture of each pixel.

11. The liquid-crystal projection device according to claim 8, further comprising a rear-side microlens array element including microlens elements arranged corresponding to individual pixels, the microlens elements suppressing divergence of light transmitted through pixel apertures of the liquid crystal panel.

12. The liquid-crystal projection device according to claim 11, a focal length of a microlens elements and a distance between the rear-side microlens array element and the transparent liquid crystal panel being such that the apertures of the pixels are arranged in a vicinity of a front-side focal point of the rear-side microlens elements.

13. The liquid-crystal projection device according to claim 8, further comprising a polarization conversion element provided between the organic electroluminescent element and the front-side microlens array element, the polarization conversion element converting a polarization of light that is output from the organic electroluminescent element, and the transparent liquid crystal panel comprising a polarizing plate that transmits light of a specified polarization, of the light that is output after passing through the polarization conversion element.

14. The liquid-crystal projection device according to claim 13, the polarization conversion element comprising:

a circular polarization selective reflection filter arranged on an organic electroluminescent element side, the polarization conversion element reflecting one circularly polarized component of right-handed circularly polarized light and left-handed circularly polarized light and transmitting another circularly polarized component; and a ¼ wavelength plate that converts circularly polarized light into linearly polarized light and that converts linearly polarized light into circularly polarized light.

15. The liquid-crystal projection device according to claim 13, the polarization conversion element comprising:

a linear polarization selective reflection filter arranged on a front-side microlens array element side, the polarization conversion element reflecting one linearly polarized component of light and transmitting another linearly polarized component; and a ¼ wavelength plate that converts circularly polarized light into linearly polarized light and that converts linearly polarized light into circularly polarized light.

16. The liquid-crystal projection device according to claim 1, further comprising a projection lens that projects on to a screen an image generated by passing through the transparent liquid crystal panel.

17. The liquid-crystal projection device according to claim 16, further comprising a transparent screen, an image projected from the projection lens being visible on a side of the transparent screen opposite from the projection lens.

18. The liquid-crystal projection device according to claim 1, further comprising:

a plurality of liquid crystal display elements that control transmission of light of respective wavelength regions of a plurality of primary colors necessary for color display;

a combining optical system that generates a color image by combining images of primary colors emitted from the plurality of liquid crystal display elements; and a projection lens that projects on to a screen a color image combined by the combining optical system.

19. The liquid-crystal projection device according to claim 18, the plurality of organic electroluminescent elements having an optical resonant structure.

20. The liquid-crystal projection device according to claim 18, further comprising a transparent screen, an image projected from the projection lens being visible on a side of the transparent screen opposite from the projection lens.

21. The liquid-crystal projection device according to claim 18, the liquid crystal display elements further comprising a front-side microlens array between the organic electroluminescent element and the transparent liquid crystal panel, the front-side microlens array including microlens elements corresponding to individual pixels of the transparent liquid crystal panel, the microlens elements collecting light emitted from the organic electroluminescent element.

22. The liquid-crystal projection device according to claim 21, the liquid crystal display elements further comprising a rear-side microlens array element including microlens elements corresponding to each pixel the microlens elements suppressing divergence of light passing through the pixel apertures of the liquid crystal panel on an output side of light that has passed through the transparent liquid crystal panel.

23. The liquid-crystal projection device according to claim 22, the front-side microlens array element and the rear-side microlens array element of the liquid crystal display elements comprising a reflection preventing film having a lowest reflectivity for light of the wavelength region of the primary color allocated to each of the liquid crystal display elements.

24. A liquid-crystal projection device, comprising, for each primary color, a liquid crystal display element including organic electroluminescent elements each having an organic thin-film layer containing organic molecules that emit light, so as to be provided with an optical resonant structure adjusted such as to emit light of respective wavelength regions of the primary colors necessary for color display and a transparent liquid crystal panel that controls transmission of light emitted from faces of the organic electroluminescent elements; and a polarization conversion element disposed between the organic electroluminescent element and the transparent liquid crystal panel, the polarization conversion element converting a polarisation of emitted light from the organic electroluminescent element, and the transparent liquid crystal panel including a polarizing plate that transmits light of a specified polarization, of the light emitted after passing through the polarization conversion element, a direction of polarization of light, provided through the polarization conversion element to the liquid crystal panel, being substantially consistent with a permeable direction of polarization of light in the polarizing plate of the liquid crystal panel, the liquid crystal projection device further comprising:

a combining optical system that generates a color image by combining images of each primary color emitted from respective liquid crystal display elements, and a projection lens that projects on to a screen the color image combined by the combining optical system.

25. The liquid-crystal projection device according to claim 24, the liquid crystal display elements, between the organic electroluminescent elements and the front-side microlens array element, further comprising a polarization conversion element that converts a polarization of emitted light from the organic electroluminescent element, and the transparent liquid crystal panel including a polarizing plate that transmits light of a specified polarization of light that is emitted after having passed through the polarization conversion element.

26. The liquid-crystal projection device according to claim 25, the polarization conversion element of the liquid crystal display elements comprising a polarization selective reflection filter that transmits light of a specified polarization with respect to the emitted light of a specified wavelength region and that reflects light of other polarizations.

27. A liquid-crystal display element, comprising:

an organic electroluminescent element having an organic thin-film layer containing organic molecules that emit light disposed between an electrode layer that reflects light and an electrode layer that transmits light;

a transparent liquid crystal panel that controls transmission of light emitted from a face of the organic electroluminescent element; and a polarization conversion element disposed between the organic electroluminescent element and the transparent liquid crystal panel, the polarization conversion element converting a polarization of emitted light from the organic electroluminescent element, and the transparent liquid crystal panel including a polarizing plate that transmits light of a specified polarization, of the light emitted after passing through the polarization conversion elements, a direction of polarisation of light, provided through the polarization conversion element to the liquid crystal panel, being substantially consistent with a permeable direction of polarization of light in the polarizing plate of the liquid crystal panel.

28. The liquid-crystal display element according to claim 27, wherein the polarization conversion element transmits a first portion of the emitted light of a desired polarization and reflects a second portion of the emitted light of a non-desired polarization.

* * * * *